United States Patent [19]

Keys et al.

[11] Patent Number: 4,884,234

[45] Date of Patent: Nov. 28, 1989

[54] DYNAMIC RAM REFRESH CIRCUIT WITH DMA ACCESS

[75] Inventors: John B. Keys; David A. Rieker, both of Cambridge, Ohio

[73] Assignee: NCR Corporation, Dayton, Ohio

[21] Appl. No.: 67,761

[22] Filed: Jun. 29, 1987

[51] Int. Cl.[4] .................. G06F 15/00; G06F 12/00
[52] U.S. Cl. ............................... 364/900; 364/964.9; 364/950.4; 364/952; 364/948.1; 365/222
[58] Field of Search ... 364/200 MS File, 900 MS File; 365/222

[56] References Cited

U.S. PATENT DOCUMENTS

| | | | |
|---|---|---|---|
| 4,142,233 | 2/1979 | Suzuki | 364/200 |
| 4,158,883 | 6/1979 | Kadono et al. | 364/200 |
| 4,249,247 | 2/1981 | Patel | 364/900 |
| 4,293,926 | 10/1981 | Amano | 364/900 |
| 4,339,808 | 7/1982 | North | 364/900 |
| 4,494,222 | 7/1985 | White et al. | 365/222 |
| 4,542,454 | 9/1985 | Breich et al. | 364/200 |
| 4,547,867 | 10/1985 | Reese et al. | 365/189 |
| 4,600,992 | 7/1986 | Boudreau et al. | 364/200 |
| 4,625,296 | 11/1986 | Shriver | 364/900 |
| 4,631,701 | 12/1986 | Kappeler et al. | 364/900 |
| 4,649,511 | 3/1987 | Gdula | 364/900 |
| 4,660,180 | 4/1987 | Tanimura et al. | 365/222 |
| 4,701,843 | 10/1987 | Cohen | 364/200 |
| 4,706,221 | 11/1987 | Satoh et al. | 364/900 |
| 4,723,204 | 2/1988 | Khera | 364/200 |
| 4,758,993 | 7/1988 | Takemae | 365/222 |

Primary Examiner—Archie E. Williams, Jr.
Assistant Examiner—Thomas C. Lee
Attorney, Agent, or Firm—Wilbert Hawk, Jr.; Albert L. Sessler, Jr.; Richard W. Lavin

[57] ABSTRACT

A semiconductor memory controller chip associated with a remote DMA device, a multispeed microprocessor and a DRAM memory requiring refreshing periodically includes refresh circuits for generating refresh signals for controlling refreshing of the memory during transparent and contention refresh operations. When a conflict occurs between the DMA device requesting access to the memory and the occurrence of a transparent refresh operation, control signals are generated to allow the memory to be refreshed prior to the time the DMA device is given access to the memory, thereby eliminating the need for a contention refresh operation. Control signals are also generated in accordance with the speed of the microprocessor for synchronizing the operation of the microprocessor with the operation of the DMA device.

8 Claims, 30 Drawing Sheets

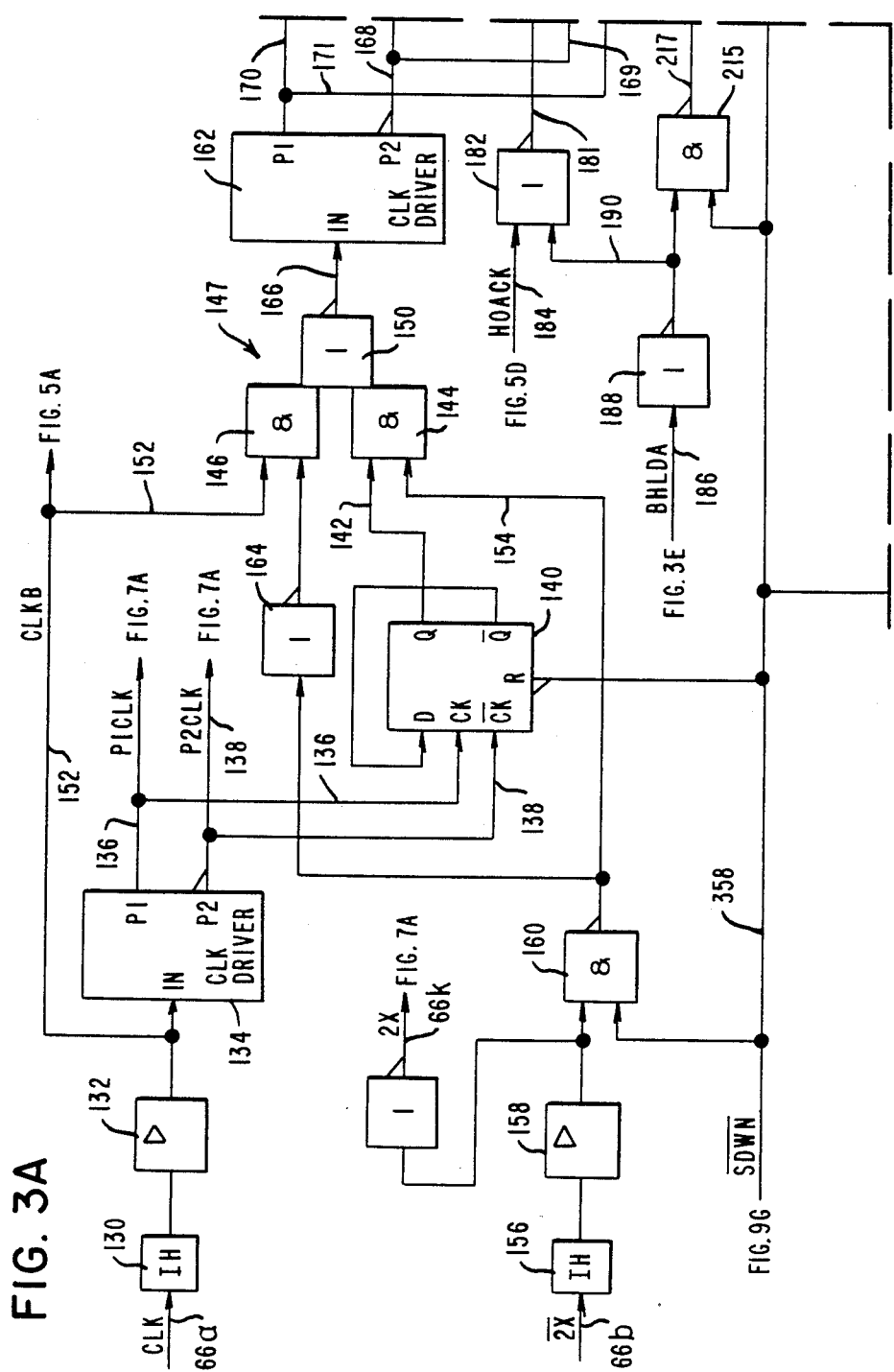

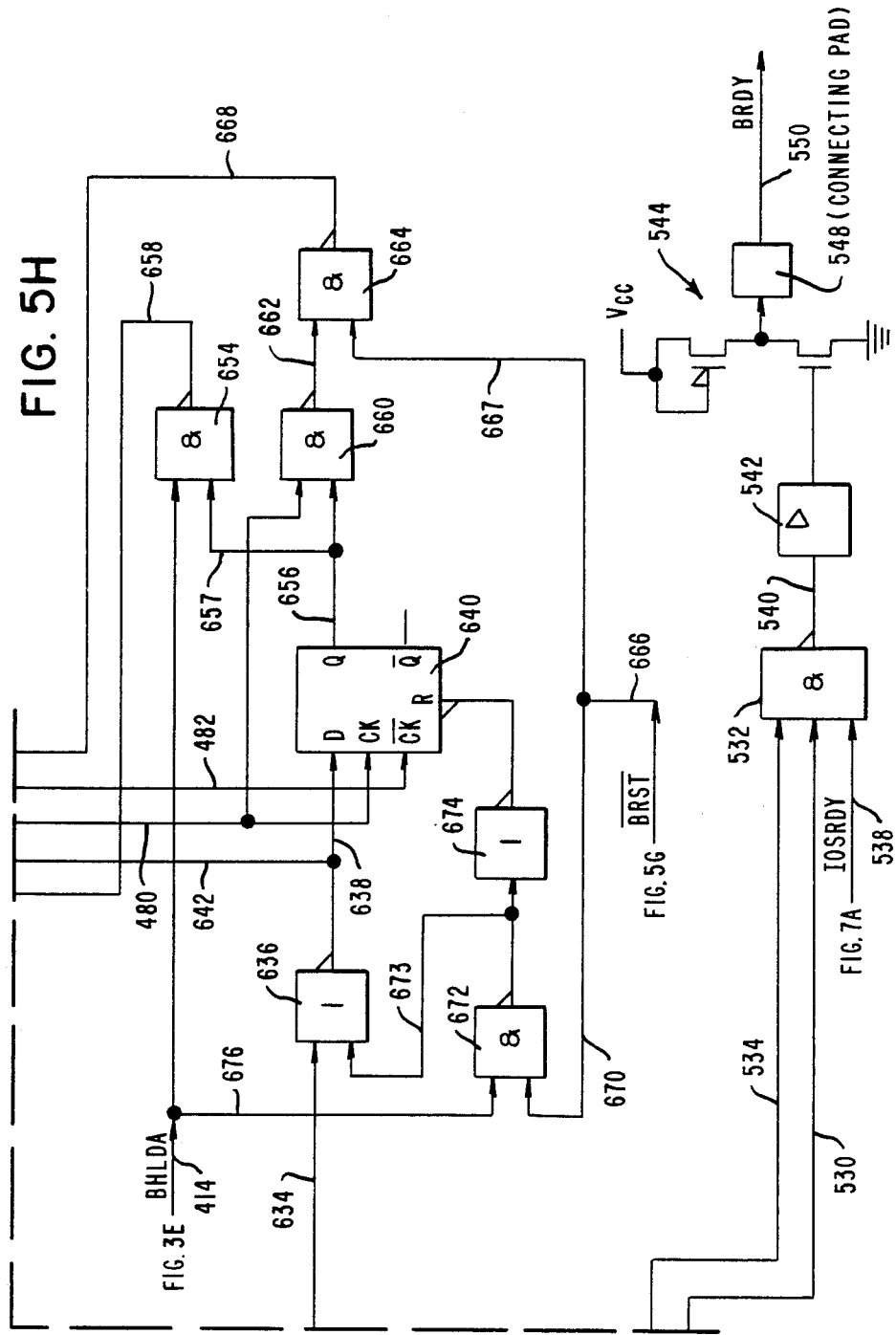

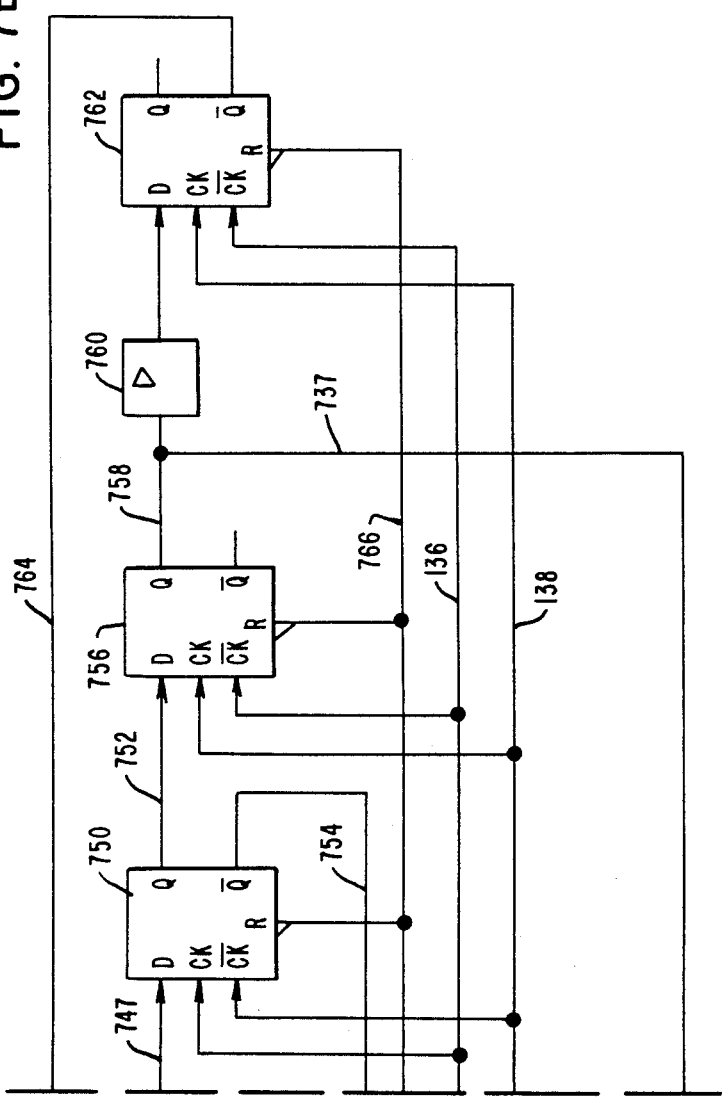

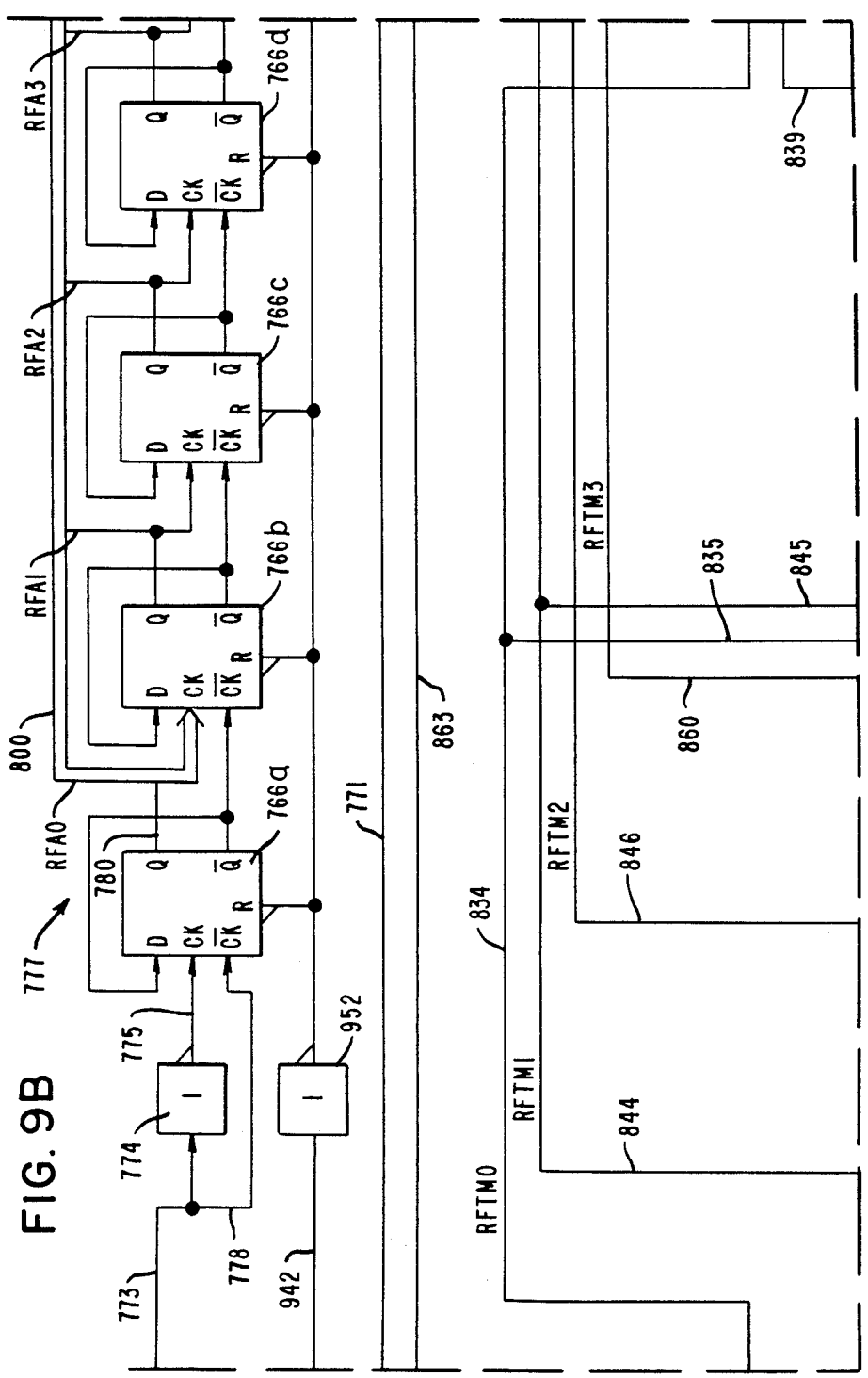

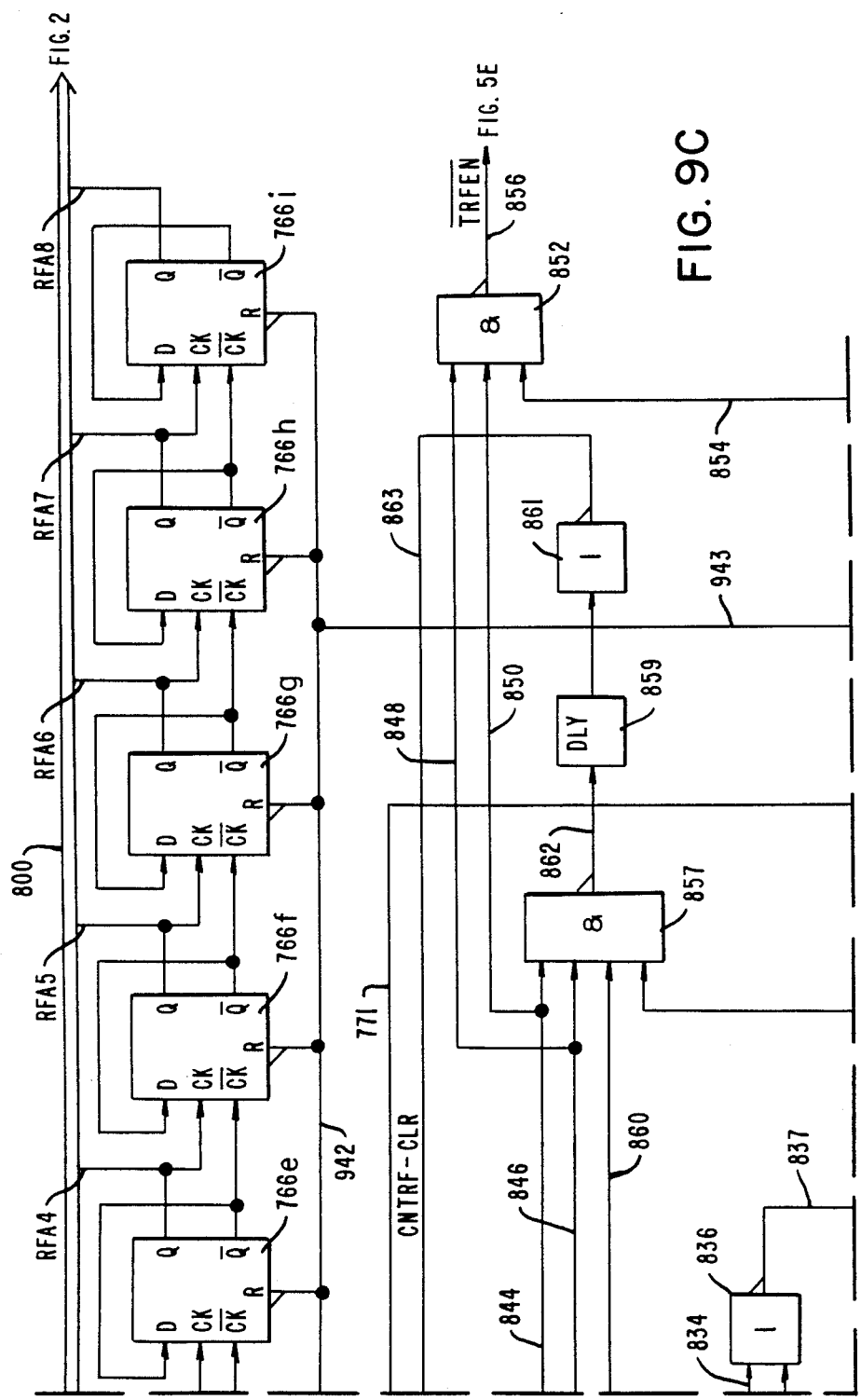

DYNAMIC RAM REFRESH CIRCUIT WITH DMA ACCESS

BACKGROUND OF THE INVENTION

I. Field of Invention

The present invention relates to the field of memory controllers and more particularly to a semiconductor chip for controlling the refreshing of a dynamic random access memory when a request for access to such memory by a remote peripheral device is present.

II. Description of the Prior Art

Dynamic random access memories (DRAM's) are composed of a plurality of memory cells in which each cell consists of a transistor network and an intrinsic capacitor. The transistors are used to charge the capacitor to store a "1" binary bit or to discharge the capacitor to store a "0" binary bit. Due to leakage, the memory cells must be refreshed periodically to keep the capacitors charged or discharged or else the integrity of the memory could not be relied upon. One common method of refreshing DRAM memories is by a row refresh approach (referred to as a RAS/-only Refresh). It is necessary to refresh each row of memory in the DRAM memory within a time period of two to four ms (milliseconds). In order to accomplish this, there are two basic approaches which could be used. One is to stop the processor from executing the current program and refresh all rows of memory. This is classified as a refresh operation. Another approach would be to interrupt the microprocessor every two to four ms and have it jump to a routine which would execute enough contiguous instructions to accomplish the memory refresh. Where there are other devices on the line with the memory system in which said devices may interrupt the normal processing operation or where there is a power down of the memory system, it is necessary that the DRAM memory be refreshed. Where a peripheral device has access to the DRAM memory at the same time that a contention refresh operation is required to occur, the processor will interrupt the memory access to allow the refresh operation to occur. Such an interruption degrades the potential system throughput by as much as ten percent.

It is therefore a principal object of this invention to provide an improved data processing system.

It is another object of this invention to increase the throughput of a data processing system.

It is a further object of this invention to provide a data processing system which allows a transparent refresh operation of a DRAM memory to occur at the time a remote peripheral device is requesting access to the DRAM memory.

It is another object of the invention to enable a multi-speed microprocessor to interface with remote peripheral devices which operate at a different processing speed.

SUMMARY OF THE INVENTION

There is disclosed a data processing system which includes a memory controller for controlling access to a DRAM memory and control circuits for generating refresh request signals periodically while an associated microprocessor or a peripheral device generates memory request signals. Where a transparent refresh operation is to be generated and a peripheral device is requesting access to the DRAM memory at the same time, the refresh operation will occur prior to the time that the microprocessor turns the DRAM memory over to the requesting peripheral device. Where the microprocessor is operating at a speed which is different from that of the peripheral devices, a circuit generates a plurality of delay signals enabling the speed of the microprocessor operation to be transparent to the peripheral devices.

BRIEF DESCRIPTION OF THE DRAWINGS

Additional advantages and features of the present invention will become apparent and fully understood from a reading of the following description, taken together with the annexed drawings, in which

FIGS. 3A-3F inclusive taken together form a detailed schematic diagram of a portion of the logic circuits in the microprocessor interface unit of FIG. 2;

FIGS. 5A-5H inclusive, taken together, form a detailed schematic diagram of the logic circuits found in the DRAM timing control unit of FIG. 2;

FIGS. 7A and 7B, taken together, form a detailed schematic diagram of another portion of the logic circuits in the microprocessor interface unit of FIG. 2;

FIGS. 7A and 7B are arranged to form the logic circuits;

FIGS. 9A-9H inclusive, taken together, form a detailed schematic diagram of the logic circuits found in the power up/down and refresh control units of FIG. 2;

DESCRIPTION OF THE PREFERRED EMBODIMENT

Throughout this description of the preferred embodiment, the presence of a slash (/) following either a symbol or an acronym represents the logical inversion of that symbol or acronym.

Figure 1:
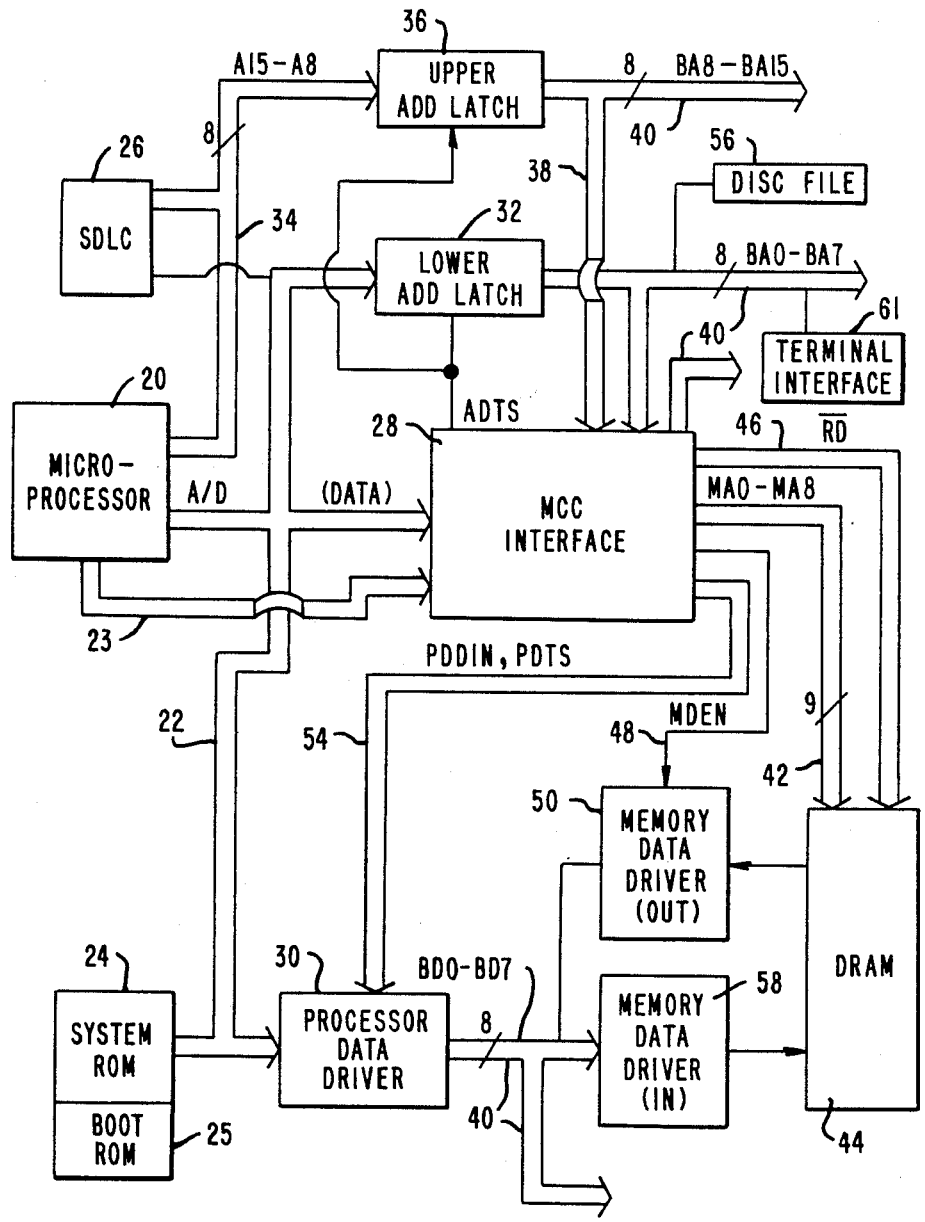
FIG. 1 is a block diagram of a data processing system including a microprocessor coupled over a system bus to a number of remote peripheral devices such as a disc file and includes the memory controller chip unit of the present invention for controlling access to the DRAM memory by the microprocessor and the peripheral devices.

Referring now to FIG. 1, there is shown a block diagram of the data processing system in which the present invention is utilized. Included in the processing system is an Intel 8085AH-2 microprocessor 20 which is commercially available from the Intel Corporation of Santa Clara, California. The microprocessor 20 is capable of operating at a system clock frequency of either 4.608 MHz or 2.304 MHz. The microprocessor 20 is coupled over an address/ data bus 22 to a system ROM memory unit 24, a SDLC communication controller 26 and a memory controller chip interface unit (MCC) 28 for controlling access to a Dynamic Random Access Memory unit (DRAM) 44. The microprocessor 20 is further coupled to the MCC unit 28 by a status control bus 23. The microprocessor 20 is also coupled over the bus 22 to a processor data driver unit 30 and a lower address latch unit 32 which latches, at the start of a machine cycle, the lower address bits A0-A7 inclusive of the data message transmitted over the eight bit system bus 40 in a manner that is well known in the art. The microprocessor 20 is further coupled over an eight bit address bus 34 to the communication controller 26 and an upper address latch 36 which latches the upper address bits A8-A15 inclusive of the data message for transmission over the address bus 38 and the system bus 40. All of the buses in the present data processing system are bi-directional. The bus 38 is coupled to the MCC unit 28.

The lower address latch unit 32 is coupled to the system bus 40 to output the lower address bits BA7–BA0 inclusive and is also coupled to the MCC unit 28. The MCC unit 28 is coupled to a nine bit memory address bus 42 which includes nine memory address lines MA8-MA0 inclusive over which the address bits MA8-MA0 inclusive are transmitted to the DRAM memory unit 44. The address bits MA0-MA8 inclusive define the location in the DRAM unit 44 at which a read or write operation is to occur. The MCC interface unit 28 will output over bus 46 to the DRAM unit the active low row address strobe signal RAS (FIG. 2), the active low column address strobe clock CASCLK/ and the active low memory write signal MWRT/. The MCC interface unit 28 outputs the memory drive enable signal MDEN/ over line 48 to a memory data driver 50 enabling the driver to drive the output data from the DRAM unit 44. The MCC unit 28 outputs over bus 54 the processor data driver in signal PDDIN to the processor driver unit 30 enabling the driver unit to drive the data from the data bus 22 to the system bus 40. The MCC unit 28 also outputs a processor data driver tri-state signal PDTS over bus 54 to the driver unit 30 putting the driver unit in a tri-state condition which will occur when a remote peripheral device such as a disc file unit 56 is performing a direct memory access operation (DMA) on the system bus 40. The driver unit 30 will output the bus data bits BD7-BD0 over the system bus 40 and to a memory data driver unit 58 for storage in the DRAM unit 44. As shown in FIG. 1, the system bus 40 is coupled to a plurality of remote peripheral devices such as a terminal interface unit 61 which controls terminal functions such as printing, displaying and keyboard operations and the disc file unit 56.

Figure 2:
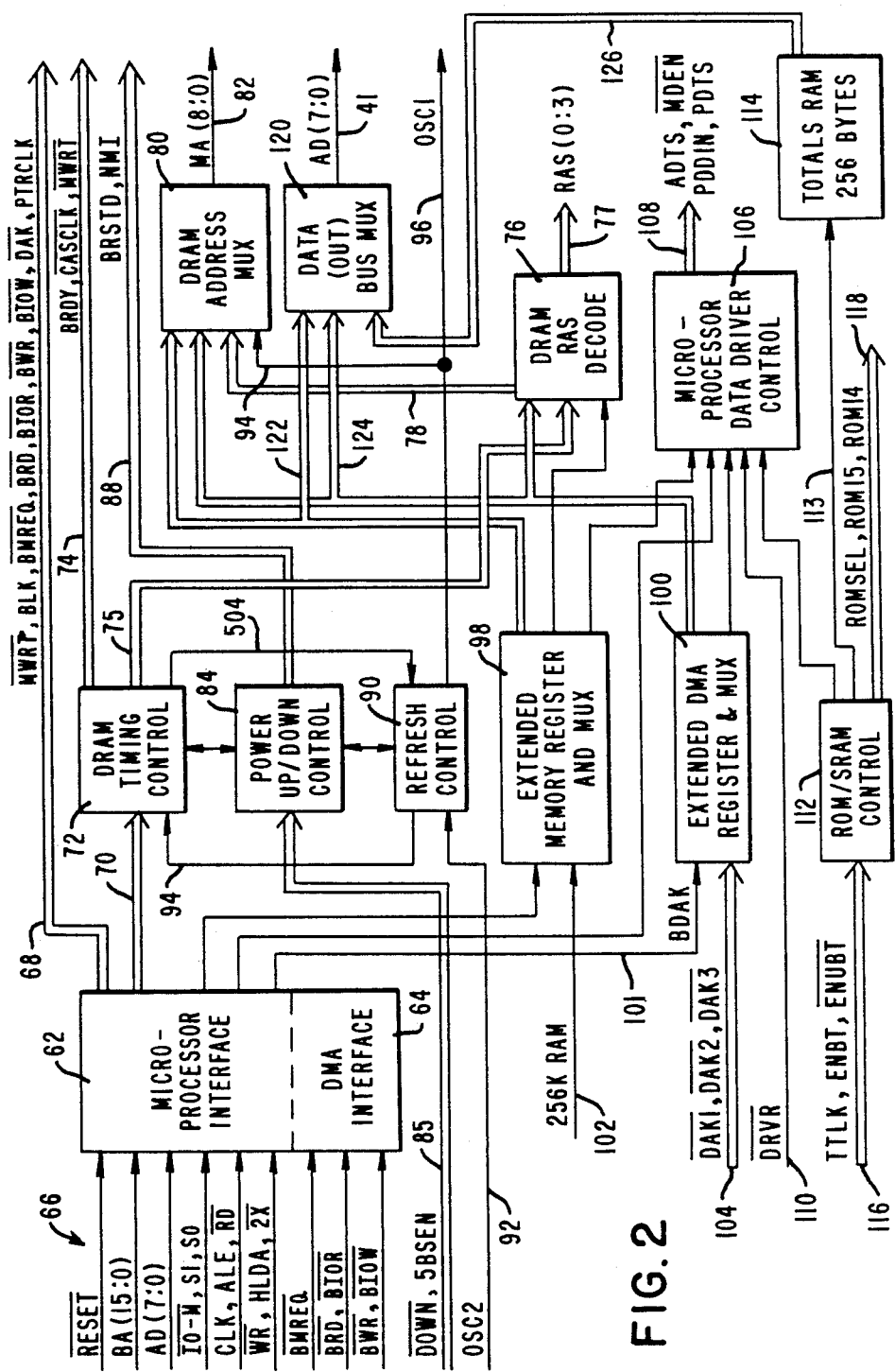
FIG. 2 is a block diagram of the memory controller chip which interfaces the microprocessor to the DRAM memory.

Referring now to FIG. 2, there is shown a block diagram of the MCC interface unit 28 (FIG. 1). Included in the MCC unit 28 is a microprocessor interface unit 62 which also includes a DMA interface portion 64. The interface unit 62 receives from the microprocessor 20 and the system bus 40 over input lines generally indicated by the numeral 66 which are part of the status control bus 23 (FIG. 1) a plurality of control signals used in controlling the accessing and the refreshing of the DRAM memory unit 44 (FIG. 1). Included in these control signals is the active low reset signal RESET/; sixteen address bits BA (15:0) appearing on the address bus 38 and the system bus 40 (FIG. 1); eight bits AD (7:0) of the lower address multiplexed with eight bits of data appearing on the bus 22; the signal IO-M/ which is an input signal from the microprocessor 20 (FIG. 1) indicating that the next processor signal to be executed will be an I/0 or memory instruction; the status signals S1-S0 indicating that the next machine cycle will be a read, write, instruction fetch or a halt; the microprocessor clock signal CLK which may be either 4.608 MHz or 2.304 MHz; the address latch enable signal ALE; the read signal RD/; the write signal WR/; the hold acknowledge signal HLDA indicating that the microprocessor has acknowledged a hold condition from another device which shares the processor system bus 40 (FIG. 1); the signal 2X/ indicating that the microprocessor is operating in the 4.608 MHz clock mode; the bus memory request signal BMREQ/ indicating, when active low, that the requesting device will be accessing the DRAM memory 44; the bus read signal BRD/ which, when active low, indicates that the requesting device is executing an I/0 read or memory read instruction; the bus input/output read signal BIOR/ indicating that an I/0 read on the system bus 40 is being executed; the bus write signal BWR/ indicating that the requesting device is executing an I/0 write or memory write instruction and the bus input/output write signal BIOW/ indicating that an I/0 write instruction on the system bus 40 is being executed. These signals are decoded by the interface 62 and outputted as bus control signals to several control circuits as will be described more fully hereinafter.

The interface unit 62 (FIG. 2), in response to receiving the signals appearing on the input lines 66, will output over bus 68 which is part of the system bus 40 (FIG. 1) the bus control signals MWRT/, BCLK, BMREQ/, BRD/, BIOR/, BWR/, BIOW/, DAK/, and PTRCLK. The functions of these signals will be explained more fully hereinafter. The DMA bus acknowledgment signal DAK/ indicates that a hold acknowledge signal HLDA has been received from the microprocessor. When this signal becomes active low, the requesting DMA device such as the disc file 56 (FIG. 1) is given control of the DRAM memory unit 44 (FIG. 1). The printer clock signal PTRCLK is used for controlling a printer operation which may occur under the control of the terminal interface 61 (FIG. 1).

The interface unit 62 (FIG. 2) will output over bus 70 to a DRAM timing control unit 72 the bus memory request signal MREQB; the memory request signal MREQ; the write signal WR/; the read signal RD; the bus clock signal CLKB; the bus reset signal BRST/; the DMA bus acknowledge signal BDAK/; the system clock signal SCLK and the memory refresh signal MREF/ which are used in accessing and refreshing the DRAM memory unit 44 as will be described more fully hereinafter.

The DRAM timing control unit 72 will output over bus 74, which is part of the memory address bus 42 (FIG. 1), the bus ready signal BRDY indicating that the system bus 40 is ready for the next execution of a machine cycle; the column address strobe clock CASCLK/ used in accessing the DRAM memory unit 44 and the memory write signal MWRT/ used in writing data into the memory unit 44. The DRAM timing control unit 72 will also output over bus 75 control signals to a DRAM RAS decode unit 76 which outputs over bus 77 the row address strobe signals RAS/ (0-3) to the memory unit 44 for determining which portion of the memory unit will be accessed during a memory cycle. The decode unit 76 will also output over bus 78 control signals to a DRAM address multiplexer unit 80 for controlling the enabling of the memory address bus 42 to the memory unit 44.

Further included in the MCC interface unit 28 (FIG. 1) is a refresh control unit 90 (FIG. 2) in which, together with the DRAM timing control unit 72, the present invention is found for controlling the refresh operation of the DRAM memory unit 44. The control unit receives over line 92 the clock signals OSC2 from an oscillator (not shown) for outputting over line 94 timing signals used in generating a refresh operation of the memory unit 44 in addition to outputting the clock signal OSC1 over line 96 to the oscillator (not shown), as will be described more fully hereinafter.

Further included in the MCC unit 28 is a power up/-down control unit 84 which receives over bus 85 a power down detect signal DOWN/ and a five volt sense signal 5BSEN which becomes active when a failure of the power supply occurs. The control unit 84 will output over bus 88 a bus reset drive signal BRSTD which, when active high, activates a system reset condition and a non-maskable interrupt signal NMI which is transmitted to the microprocessor 20 indicating that the microprocessor should halt any activity on the system bus and prepare the system bus for an orderly shutdown.

The DRAM memory unit 44 includes four 16K pages of native memory and an extended memory of sixty 16K pages of memory. For controlling access to this memory, there is included in the MCC unit 20 a pair of extended memory register and multiplexer units 98 and 100 used for addressing the extended memory in the memory unit 44. The register and multiplexer unit 98 receives over line 102 the external control signal 256-KRAM. The DMA register and multiplexer unit 100 receives over bus 104 three DMA bus acknowledge signals DAK1/, DAK2/, and DAK3/ representing the priority of the DMA device requesting access to the memory unit 44.

A microprocessor data driver control unit 106 receives the output signals from the multiplexer units 98 and 100 for outputting over bus 108 an address driver tri-state signal ADTS indicating that a DMA device has been enabled to drive the system address bus; the memory driver enable signal MDEN/; the processor data driver in signal PDDIN and the processor data driver tri-state signal PDTS which controls the processor data driver flow direction. The data driver control unit 106 also receives over line 110 the driver signal DRVR/ used in enabling the driver control unit 106. The MCC unit 20 further includes a ROM/SRAM control unit 112 that controls access to the system ROM 24 (FIG. 1) and a totals RAM unit 114 in which are stored the machine totals generated as a result of a data processing operation. In order to access both the system ROM unit 24 and the totals RAM unit 114, enabling signals appear on bus 116 for input into the Control unit 112. These signals include the totals lock signal TTLK for enabling access to the totals RAM unit 114; the enabled boot signal ENBT and the enable upper boot signal ENUBT/ used for accessing a section of the ROM unit 24 (FIG. 1) labeled BOOT ROM section 25. The BOOT ROM section 25 contains the required software to boot the machine upon power-up and to enable the operator of the terminal to change the machine configuration portion of the totals RAM unit 114. The ROM/SRAM control unit 112 will output over bus 118 the ROM control signals including the ROM select signal ROM-SEL and the ROM upper address bits ROM 15 and ROM 14.

To assist in the direction of data transfer to and from the MCC unit 28 within the system environment, a data bus multiplexer unit 120 receiving the signals from the multiplexer units 98, 100 and the totals RAM unit 114 over internal buses 122, 124 and 126, respectively, is used for outputting over the data bus 41 the data bits A–D (7–0) inclusive. Since the data bus 41 is bi-directional, the data bits A–D (7–0) inclusive can flow in either direction.

Figure 3B:
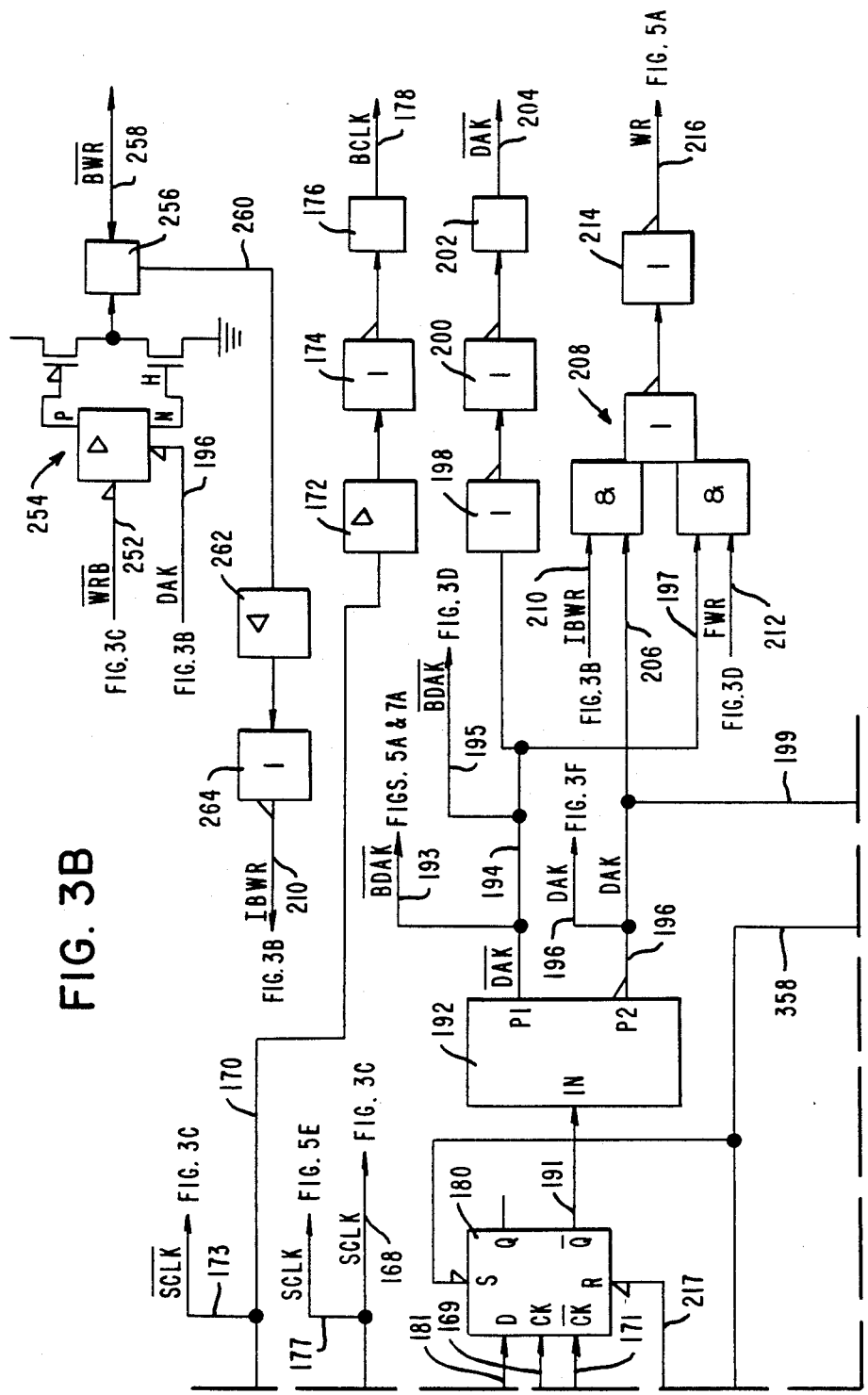

Referring now to FIGS. 3A–3F inclusive, there is shown a portion of the logic circuits contained in the microprocessor interface unit 62 (FIG. 2) of the MCC unit 28 (FIG. 1) for generating control signals used in controlling access to the DRAM memory unit 44 and the system bus 40 (FIG. 1). As previously described, the microprocessor interface unit 62 receives a plurality of control signals over lines 66 (FIG. 2) from the microprocessor 20 (FIG. 1) for decoding the signals for use in enabling the MCC unit 28 to address the DRAM memory unit 44 (FIG. 1). As shown in FIG. 3A, the main processor cock signal CLK appearing on line 66a may be operated at a frequency of either 4.608 MHz or 2.306 MHz. These clock signals are transmitted through an input pad 130 and an input buffer 132 into a clock driver 134 which outputs the clock signals P1CLK over line 136 and its inverted signal P2CLK over line 138. These signals are transmitted to the microprocessor interface unit 62 (FIGS. 2 and 7A) for use in synchronizing the speed of the microprocessor with the speed of the peripheral devices on the system bus 40 (FIG. 1).

The clock signals appearing on lines 136 and 138 are inputted into a divide-by-two D-type flip flop 140 whose Q output is connected over line 142 to one input of an AND gate 144 which forms a portion of a multiplexer generally indicated by the numeral 147 and which also includes the AND gate 146 and the NOR gate 150. The AND gate 146 receives the system clock signals now appearing on input line 152 as CLKB while the AND gate 144 receives over input line 154 the signal 2X/ which appears on input line 66b and transmitted from the microprocessor 20 (FIG. 1). As previously described, when the system clock signals CLK appear on input line 66a at a frequency of 4.608 MHz, the signal 2X/ will be active low. When the signal 2X/ is low, the signal is transmitted through the input pad 156 and the input buffer 158 to one input of a NAND gate 160 whose high output signal is transmitted over line 154 to the AND gate 144 which selects the 2.304 MHz clock signals coming from the divide-by-two flip flop 140 appearing on line 142 for output to the clock driver 162. If the clock signal CLK is operating at 2.306 MHz, the signal 2X will be high which is inverted by the NAND gate 160 and then inverted by the inverter 164 enabling the AND gate 146 to transmit the clock signals appearing on line 152 to the clock driver 162. It will thus be seen that the multiplexer 147 will always output the system clock signals at a frequency of 2.304 MHz.

The clock driver 162 (FIG. 3A) receiving the clock signals on its input line 166 will output over line 168 the system clock signal SCLK and its inverted clock signal SCLK/ over line 170. This latter signal is transmitted through the buffer 172 (FIG. 3B), the inverter 174, the connecting pad 176 and over line 178 as the system bus clock BCLK. The system clock signals SCLK and SCLK/ are also inputted over lines 169 and 171 into the clock inputs of a D-type flip-flop 180 (FIG. 3B). The D input of the flip-flop 180 is connected over line 181 to the output of a NOR gate 182 (FIG. 3A) which receives over its input line 184 the hold off acknowledge signal HOACK. The signal becomes active high when a transparent refresh operation is required at the time the interface unit 62 (FIG. 2) receives the signal HLDA indicating that the microprocessor 20 is turning over the system bus 40 to a requesting peripheral device for access to the DRAM memory unit 44. As will be explained more fully hereinafter, the present invention generates a transparent refresh prior to the time the bus is turned over to the requesting DMA device. When that occurs, a bus acknowledge signal BHLDA appearing on line 186 (FIG. 3A) and transmitted through the inverter 188 is outputted over line 190 to the other input of the NOR gate 182. These signals will enable the NOR gate 182 to output a high signal to the flip-flop 180 which outputs the DMA acknowledge signal DAK over line 191 to the clock driver 192 when clocked by the clock signals appearing on lines 169 and 171. The clock driver 192 outputs over line 194 the inverted DMA acknowledge signals DAK/ and over line 196 the acknowledge signal DAK. The signal DAK/ is transmitted through the inverters 198, 200, the connector pad 202 and over line 204 of the system bus 40 (FIG. 1).

The DMA acknowledge signal DAK appearing on the output line 196 of the clock driver 192 (FIG. 3B) is outputted over line 206 to one input of a multiplexer generally indicated by the numeral 208 which receives over line 210 the input bus write signal IBWR, over line 212 the fast write signal FWR and over line 197 the bus DMA acknowledge signal BDAK/. When a remote DMA device or the microprocessor 20 is requesting access to the DRAM memory unit 44 to perform a write operation, the multiplexer 208 will output the write signal WR through the inverter 214 and over line 216 which is part of the system bus 40 in response to the signal level of the DMA acknowledge signal DAK.

When a power down condition exists in the system as a result of a power failure to the DRAM memory unit 44 (FIG. 1), the signal DOWN/ appearing on line 86 (FIG. 9G) of bus 85 (FIG. 2) and transmitted from the power up/down control unit 84 (FIG. 2) will become active low as the signal SDWN/. This signal is transmitted over line 358, through NAND gate 215 and over line 217, thereby resetting the flip-flops 140 (FIG. 3A) and 180 (FIG. 3B). The systems clock signals SCLK/ and SCLK appearing on lines 173 and 177 respectively (FIG. 3B) are inputted into the clock inputs of a D-type flip-flip 218 (FIG. 3C) whose output signals are inputted into a second D-type flip-flop 220 which divides the system clock signals by four. The resulting clock signals outputted over line 221 are inverted by the inverter 222 and 224 and outputted through the connecting pad 226 and over line 228 as the printer clock signals PTRCLK for controlling the operation of a printer controlled by the terminal interface 61 (FIG. 1).

Figure 3C:
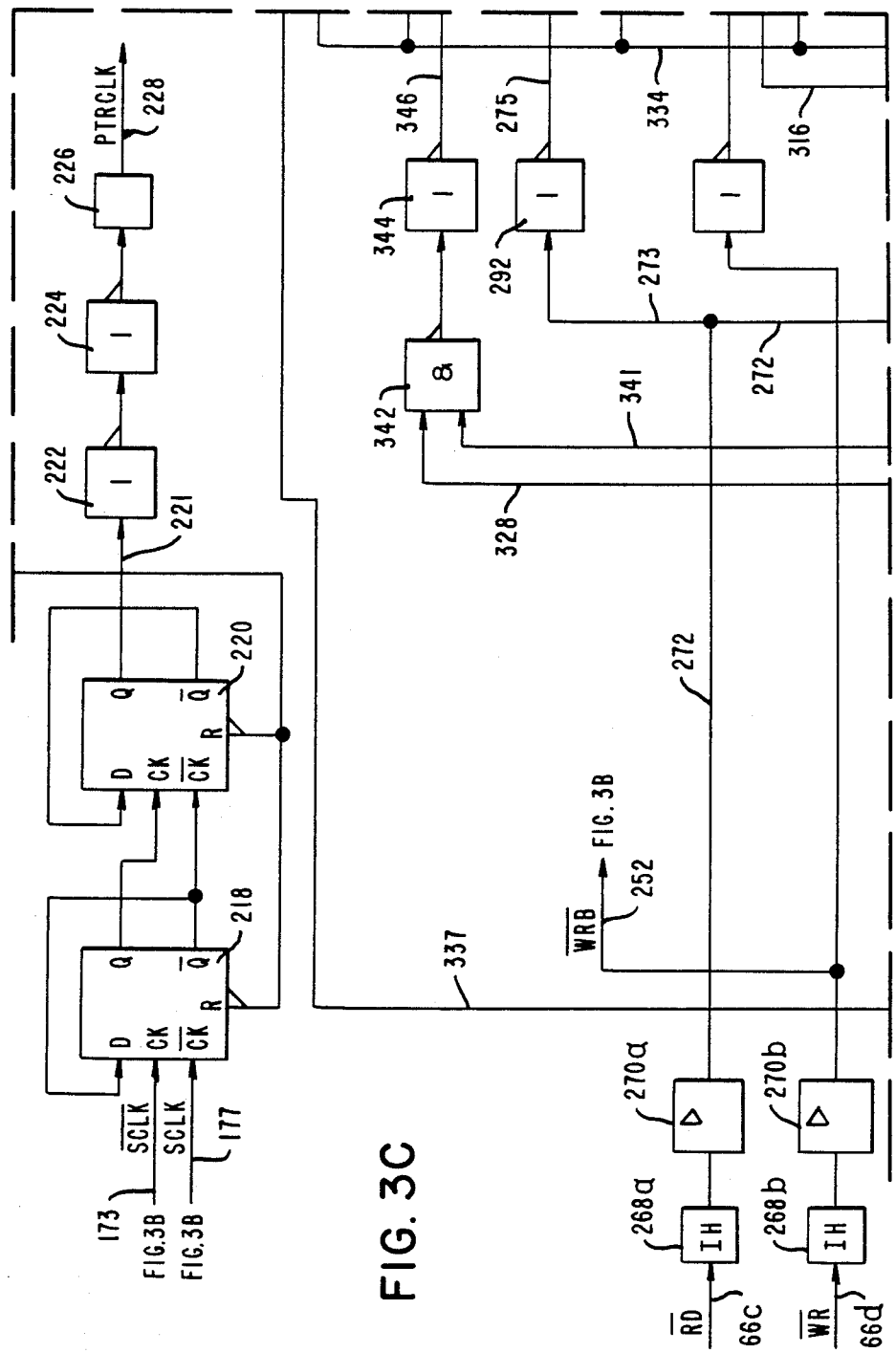
Figure 3D:
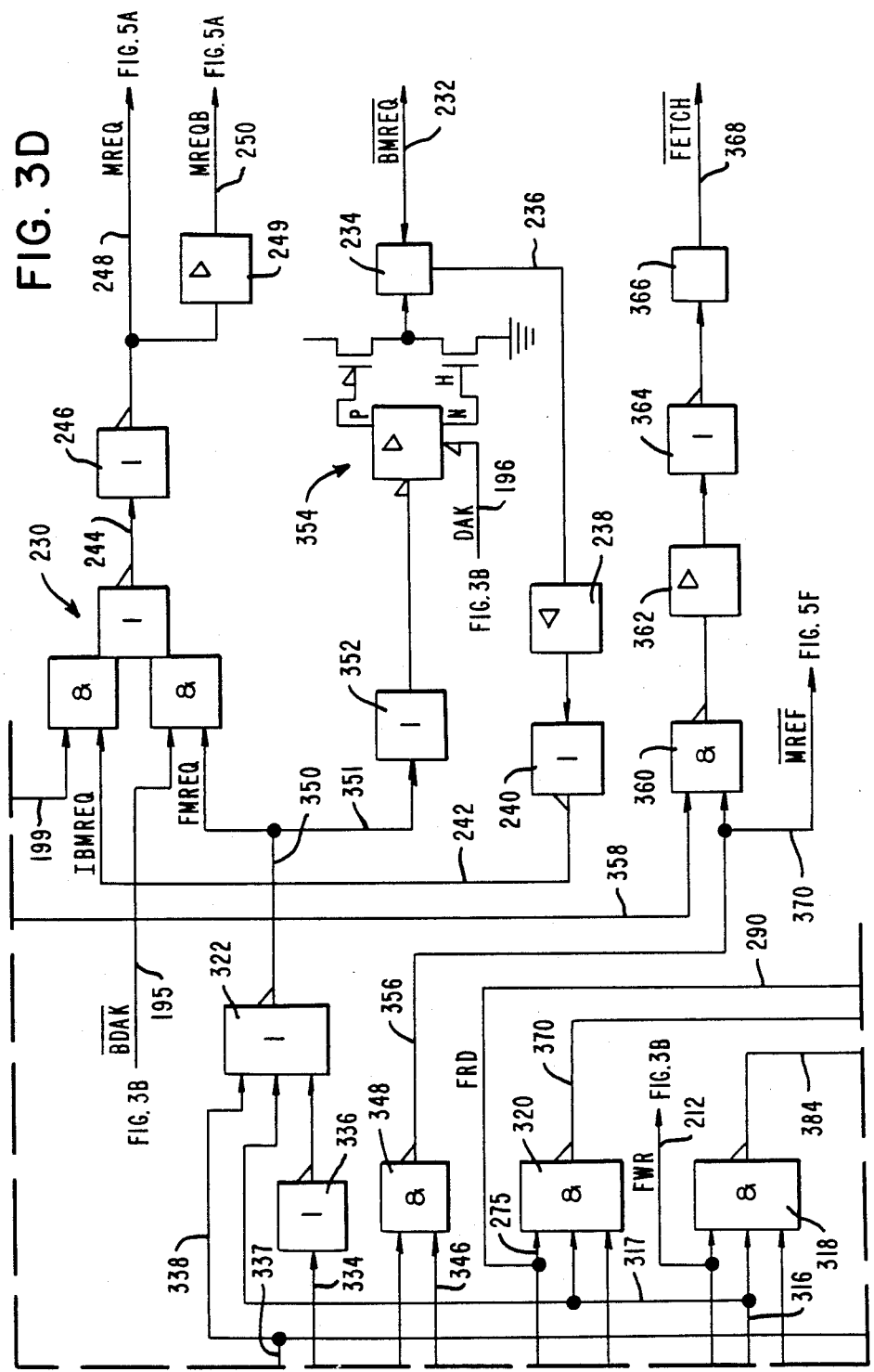

The DMA bus acknowledge signal DAK outputted by clock driver 192 and appearing on line 199 (FIG. 3B) is inputted into one input of a multiplexer generally indicated by the numeral 230 (FIG. 3D). The multiplexer 230 receives over its input line 242 the input bus memory request signal IBMREQ which is inputted into the DMA interface 64 (FIG. 2) whenever a DMA operation is occurring. This signal is derived from the bus memory request signal BMREQ/ appearing on the bi-directional line 232 which is transmitted through the connecting pad 234, over line 236, the input buffer 238, inverter 240 and line 242 to one input of the multiplexer 230. When the microprocessor 20 has control of the DRAM memory unit 44, the multiplexer 230 will output the memory request signal MREQ/ over line 244 which is inverted by the inverter 246 and outputted over line 248 to the timing control unit 72 (FIG. 2). The signal is also transmitted through the output buffer 249 and over line 250 to the timing control unit 72 as the buffered memory request signal MREQB.

If a DMA device has gained control of the system bus 40, the bus memory request signal BMREQ/ will be inputted over line 232 (FIG. 3D) as previously described. In addition, the write signal WRB/ appearing on line 252 (FIGS. 3C and 3B) will be inputted into a tri-state output driver represented by the numeral 254 (FIG. 3B) which is controlled by the active high DMA acknowledge signal DAK appearing on line 196 to disable the driver so as to provide a very high impedance to the write input signal appearing on line 258. The driver 254 will output the bus write signal BWR/ through the output pad 256 and over the bi-directional line 258 of the system bus 40. If a requesting DMA device has been given control of the system bus, the DAK signal will be high and the bidirectional bus write signal BWR/ will be inputted into the connecting output pad 256, over line 260 and through the input buffer 262 and the inverter 264 as the input bus write signal IBWR appearing on line 210 which is inputted into the multiplexer 208 (FIG. 3B).

Figure 3E:
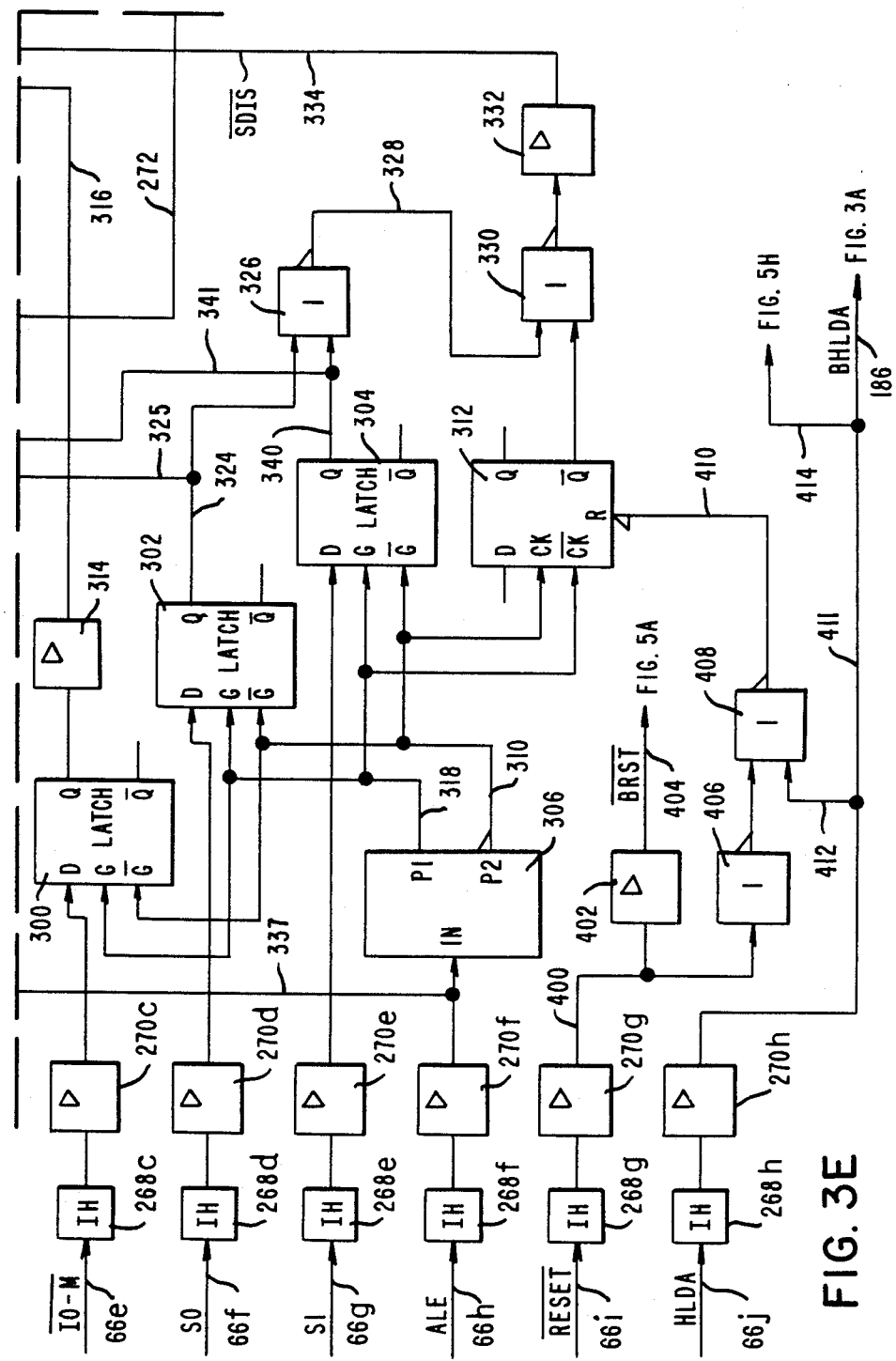
Figure 3F:
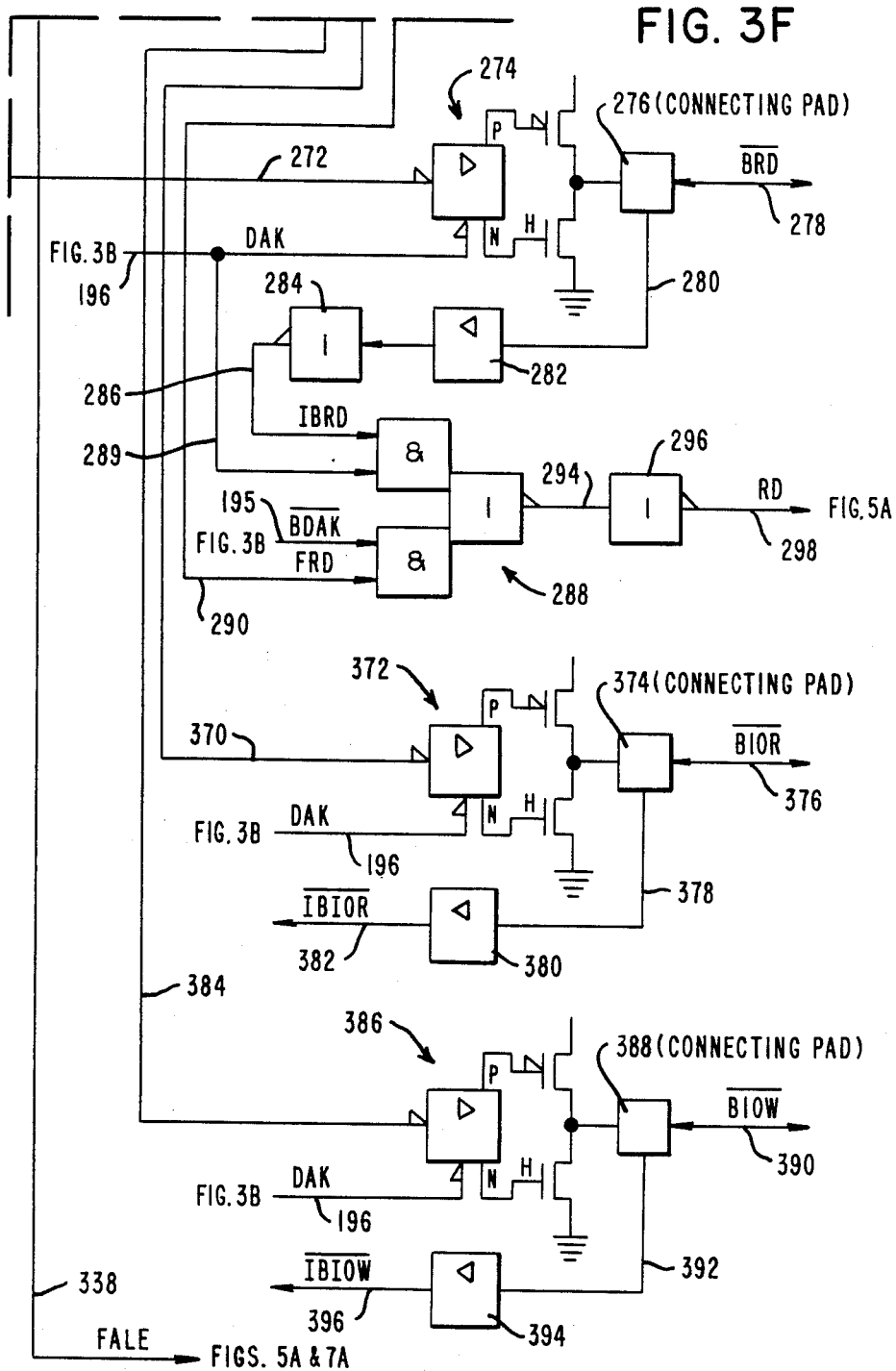
Figure 4:
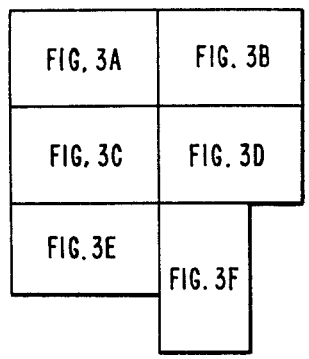
FIG. 4 is a diagram showing how FIGS. 3A-3F inclusive are arranged to form the logic circuits.
Figure 8:
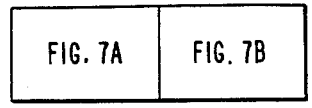
FIG. 8 is a diagram showing how
Figure 6:
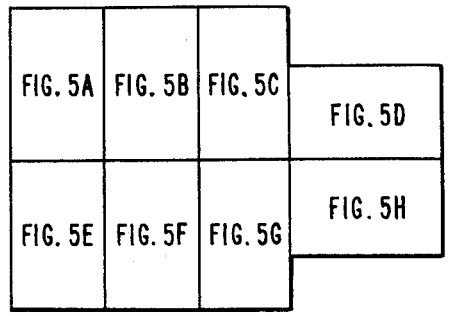
FIG. 6 is a diagram showing how FIGS. 5A-5H inclusive are arranged to form the logic circuits.
Figure 10:
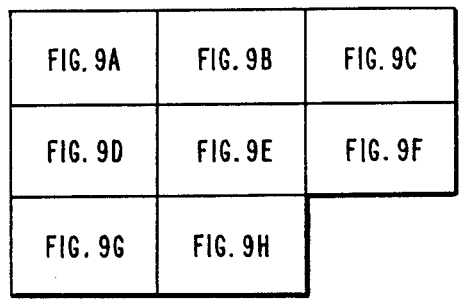
FIG. 10 is a diagram showing how FIGS. 9A-9H inclusive are arranged to form the logic circuits.
Figure 5A:
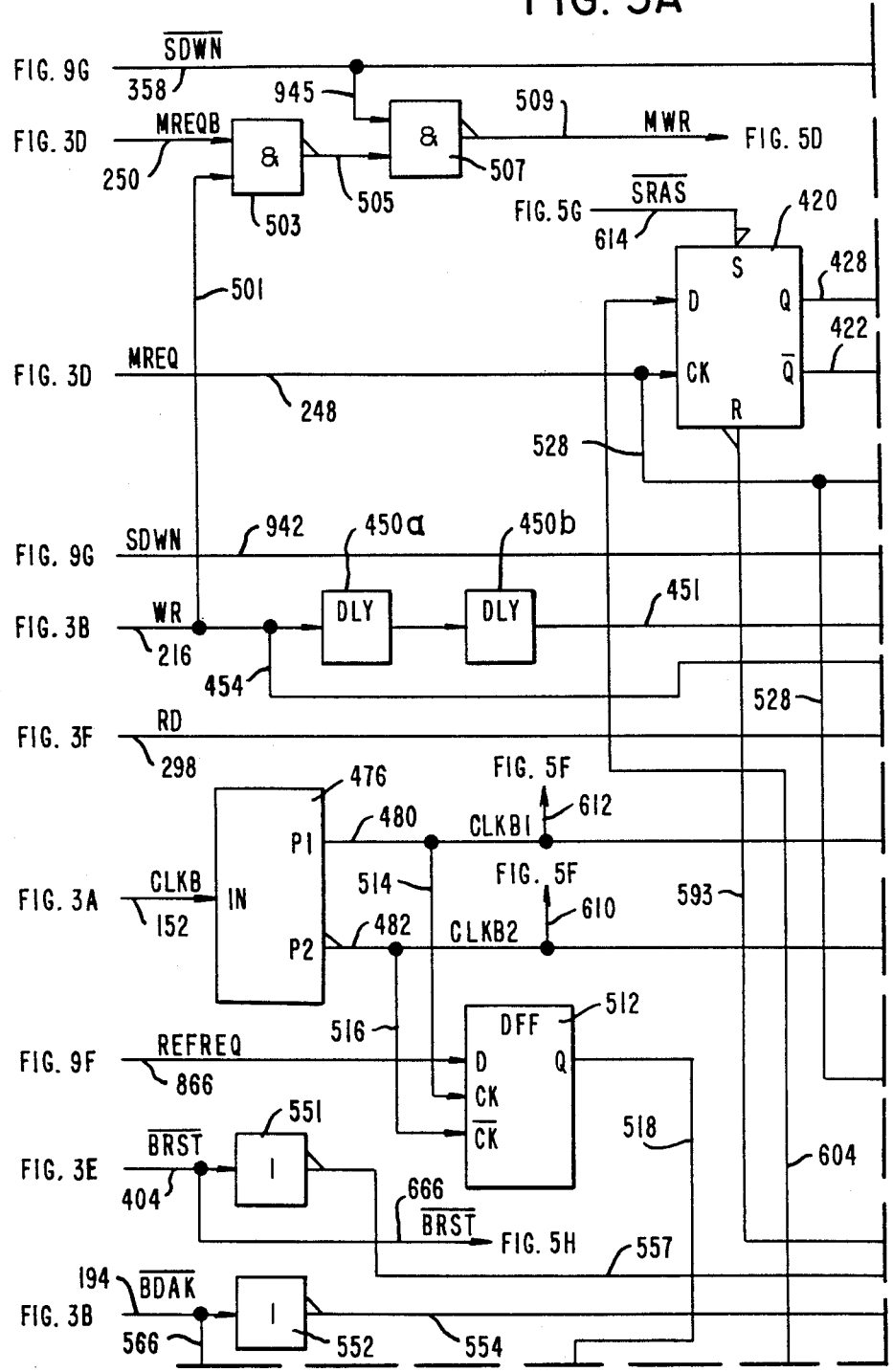

Referring to FIGS. 3C and 3E, there are shown the control signals outputted by the microprocessor 20 to indicate what operating condition the microprocessor is in and what type of operating cycle it is performing. Appearing on input line 66c (FIG. 3C) is the read signal RD/ which is active low when the microprocessor 28 is performing a read machine cycle. This signal is transmitted through a connection pad 268a, an input buffer 270a and over line 272 to the tri-state output driver represented by numeral 274 (FIG. 3F). The output driver 274 is controlled by the DMA acknowledge signal DAK appearing on input line 196 as previously described which enables the input signal RD/ to be transmitted through the connecting pad 276 and over the bi-directional line 278 as the bus read signal BRD/. If a DMA device has gained control of the system bus, the signal BRD/ will be inputted over the bi-directional line 278 (FIG. 3F), through the connecting pad 276 and over line 280, the input buffer 282, the inverter 284, and over line 286 to one input of a multiplexer represented by the numeral 288 as the input bus read signal IBRD. The other inputs to the multiplexer 288 are the DMA acknowledge signal DAK appearing on line 289, the bus DMA acknowledge signal BDAK/ appearing on line 195 and a fast read signal FRD appearing on lines 290 which is derived from the read signal RD/ appearing on lines 272 and 273 and inverted by the inverter 292 (FIG. 3C). The multiplexer 288 will output the read signal RD/ over line 294, the inverter 296 and over line 298 of bus 70 as the read signal RD to the DRAM timing circuit 72 (FIGS. 2 and 5A).

The microprocessor status signals S0, S1 appearing on input lines 66f, 66g respectively and the control signal IO-M/ appearing on line 66e (FIG. 3E), are latched whenever the address latch enable signal ALE appearing on line 66h goes low. As shown in FIG. 3E, latch flip-flop circuits 300, 302 and 304 receive the input signals IO-M/, S0/ and S1 respectively. The signal ALE is outputted over line 337 (FIGS. 3E and 3F) as the fast address latch enable signal FALE (FIG. 3F) to the DRAM timing control unit 72 and the extended DMA register 100 (FIG. 2). This signal is also inputted into a clock driver 306 (FIG. 3E) which outputs over line 318 the signal ALE and over line 310 the signal ALE/ to the latch circuits 300, 302 and 304. In addition, the signals ALE and ALE/ are inputted into the clock inputs of a D-type input flip-flop 312. The Q output signal IO-M/ of latch 300 is transmitted through the buffer 314 and over lines 316 (FIGS. 3E and 3D) and 317 to one input of the NAND gates 318, 320, and to one input of the NOR gate 322 (FIG. 3D). The high Q output signal S0 of latch circuit 302 (FIG. 3E) is transmitted over line 324 to one input of the NOR gate 326. The output signal of gate 326 is transmitted over line 328 to one input of the NOR gate 330 whose low output signal is transmitted through the buffer 332 and over line 334 to the inverter 336 (FIG. 3D) and to one input of the NOR gate 322. The NOR gate 322 also receives over its input line 338 the low signal ALE (FIG. 3E) enabling the gate to output over line 350 the high fast memory request signal FMREQ.

The output signal FMREQ of the NOR gate 322 is transmitted over lines 350 and 351 through the inverter 352 to the tri-state output driver represented by the numeral 354 which outputs the bus memory request signal BMREQ/ through the connecting pad 234 and over the output line 232. As previously described, when a DMA device has gained control of the system bus, the memory request signals MREQ and MREQB appearing on lines 248 and 250 will be generated to enable the DMA device to control access to the DRAM memory unit 44. When the processor has control of the system bus, the signal BMREQ/ will become active to indicate a memory access machine operation.

The high Q output signal S1 of the latch circuit 304 (FIG. 3E) is transmitted over line 340 to one input of the NOR gate 326 and over line 341 to the NAND gate 342 (FIG. 3C) whose high output signal is transmitted through the inverter 344 and over line 346 to one input of the NAND gate 348 (FIG. 3D) which outputs the memory refresh signal MREF/ thereby initiating a transparent refresh operation as will be described more fully hereinafter.

The low output signal MREF/ of the NAND gate 348 is transmitted over line 356 to one input of a NAND gate 360 whose output signal FETCH/ is active low when the processor 20 (FIG. 1) is executing an opcode fetch instruction. This signal is transmitted through the buffer 362, the inverter 364, the connecting pad 366 and over line 368 to the system bus 40 (FIG. 1). The output signal MREF/ of NAND gate 348 is also transmitted over line 370 to the DRAM timing control unit 72 (FIG. 2). As will be described more fully hereinafter, the signal MREF/ will remain active low when a transparent refresh of the DRAM memory unit is occurring.

The output signal of the NAND gate 320 (FIG. 3D) is labeled as a bus input/output read signal BIOR/ which becomes active low when a I/0 read of the system bus is being executed. This signal is transmitted over line 370 to the tri-state output driver indicated by the numeral 372 (FIG. 3F) whose output signal is transmitted through the connecting pad 374 and over the output line 376 to the system bus 40. When a DMA device is executing a read operation on the system bus, the signal DAK appearing on input line 196 will tri-state the driver 372 to allow the signal BIOR/ appearing on input line 376 to be transmitted over line 378 from the connecting pad 374, through the buffer 380 and out over line 382 for use within the MEMORY controller chip 28 (FIG. 1).

The output signal of the NAND gate 318 (FIG. 3D) is the bus input/output write signal BIOW/ which is transmitted over line 384 to the tri-state output driver indicated by the numeral 386 (FIG. 3F). The signal is then transmitted through the connecting pad 388 and over line 392 to the extended memory and DMA registers 98 and 100 (FIG. 2). In the same manner as described previously, the acknowledge signal DAK appearing on line 196, which is active high when a DMA device such as the disc file 56 (FIG. 1) is executing a write operation on the system bus, will tri-state the driver 386 to allow the signal BIOW/ appearing on input line 390 to be transmitted through the pad 388, over line 392, through the buffer 394 and over line 396 as the bus signal BIOW/ to the extended memory and DMA registers 98 and 100 (FIG. 2).

When the microprocessor 20 (FIG. 1) outputs the reset signal RESET/ over input line 66i (FIG. 3E) during a reset operation, the signal will be transmitted through the input pad 268g, buffer 270g and over line 400 through the buffer 402 and out over line 404 as the bus reset signal BRST/ which resets various circuits within the MEMORY control circuit 28. During a power up/down operation, the power up/down control 84 (FIG. 2) outputs the signal SDWN/ (FIGS. 3A and 9G) over input line 358 which forces the output of the interface unit 28 (FIG. 1) and internal circuits (FIGS. 3A–3D inclusive) within the interface 62 (FIG. 2) to a low power state in a manner that is well known in the art.

The signal RESET/ (FIG. 3E) is also transmitted over line 400 and through the inverter 406 into one input of the NOR gate 408 whose low output signal is transmitted over line 410 to the reset input of the flip-flop 312 resetting the flip-flop. The other input to the NOR gate 408 receives the hold acknowledge signal HLDA appearing on input line 66j (FIG. 3E) which is transmitted through the input pad 268h, the buffer 270h and over lines 411 and 412 to the NOR gate 408 and also over line 414 to the DRAM timing control circuit 72 (FIG. 2). The signal is also transmitted over line 186 as the bus hold acknowledge signal BHLDA to a circuit (FIGS. 3A and 3B) within the interface unit 62 (FIG. 2A) for controlling the generation of the signal DAK in a manner to be described hereinafter. The hold acknowledge signal HLDA is active high when the microprocessor 20 acknowledges a hold condition from a DMA peripheral device that is requesting access to the DRAM memory unit 44 (FIG. 1), as will be explained more fully hereinafter.

Referring now to FIGS. 5A–5H inclusive, there are shown the logic circuits found in the DRAM timing control unit 72 (FIG. 2) which generates the timing windows enabling the microprocessor 20 (FIG. 1) or a DMA device such as the disc file 56 (FIG. 1) access to the DRAM memory unit 44. The control unit 72 also enables a transparent refresh or a contention refresh operation to occur. As is well known in the art, the DRAM memory unit 44 is composed of memory cells arranged in a row and column type of array. In order to provide a refresh operation or a memory access operation, the row address lines are multiplexed with the column address lines.

As shown in FIG. 5A, the memory request signal MREQ appearing on the input line 248 (FIG. 3D) and outputted by the microprocessor interface 62 (FIG. 2) is transmitted as a clock signal to a D-type flip-flop 420 clocking the flip-flop. The clocking of the flip-flop 420 results in a row address strobe clock RASCLK/ signal being outputted on its Q/ output line 422 which is inverted by the inverter 424 (FIG. 5B) and outputted over line 426 to the DRAM RAS decode circuit 76 (FIG. 2) for initiating a memory access operation of the DRAM memory unit 44. Clocking of the flip-flop 420 by the signal MREQ also outputs on its Q output line 428 a control signal which is transmitted through three delay circuits 430a, 430b and 430c (FIG. 5B) to the clock input of a D-type flip-flop 432. This signal clocks the flip-flop 432 resulting in the high column enable signal CAEN appearing on its Q output line 434 which is inputted into the DRAM address multiplexer unit 80 (FIG. 2) for changing the output signals of the multiplexer unit 80 from a RAS address to a CAS address. The clocking of the flip-flop 432 will also output a clock signal over its Q/ output line 436 which is transmitted through the delay circuits 438a and 438b (FIG. 5C), through the NOR gate 440, the delay circuit 442 to the clock input of a D-type flip-flop 444 thereby clocking the flip-flop.

Figure 5B:
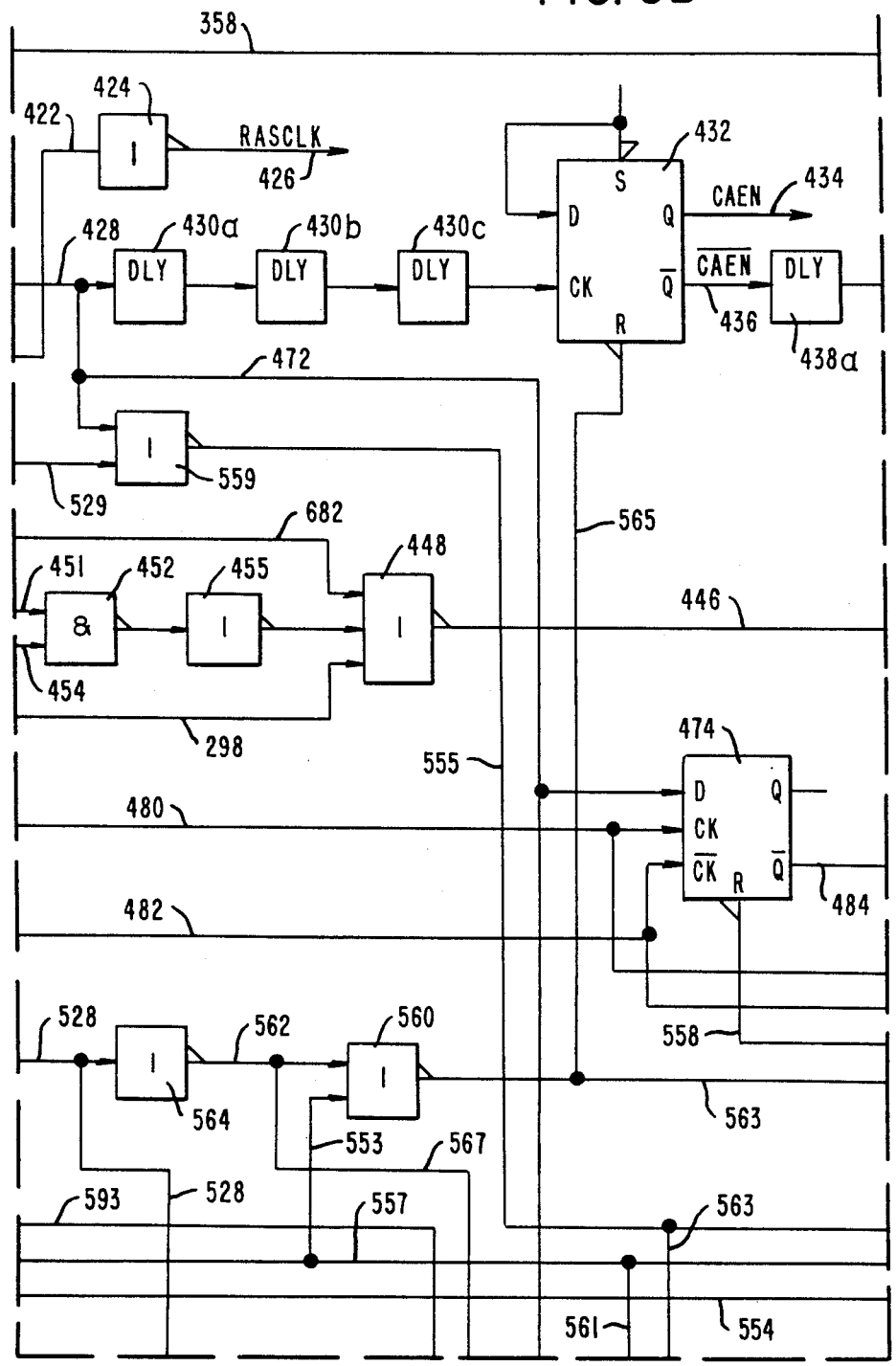

The NOR gate 440 also receives an output signal over lines 446 and 447 from the NOR gate 448 (FIG. 5B). The NOR gate 448 receives over input line 298 the read signal RD (FIG. 5A), the write signal WR (FIG. 5A) appearing on line 216 which is transmitted through the delay circuits 450a and 450b and over line 451 to one input of the NAND gate 452 (FIG. 5B) which also receives the write signal WR over line 454. The NAND gate 452 will output a delayed write signal through the inverter 455 to the NOR gate 448 which outputs a delayed write or read signal DWRR over lines 446 and 447 to the NOR gate 440 (FIG. 5C) and also through an inverter 456 which disables the reset of the flip-flop 444 over line 459. This action allows the flip-flop 444 to be clocked by the delay signal CAEN/ appearing on the Q/ output line 436 of flip-flop 432 (FIG. 5B) and being transmitted through delay circuits 438a and 438b, NOR gate 440 and delay circuit 442. At the end of a memory access cycle, the read signal RD or write signal WR (FIG. 5A) will become inactive, causing the delayed write or read signal DWRR appearing on the reset line 459 to go low thereby resetting the flip-flop 444.

The delayed bus write or read signal DWRR is also transmitted over line 458 to the ROM/SRAM control circuit 22 (FIG. 2). The clocking of the flip-flop 444 will output the column address strobe clock CASCLK/ over its Q/ output line 460 through the NOR gate 462 (FIG. 5D), the buffer 464, the inverter 466, the connecting pad 468 and over line 470 which is part of the bus 74 (FIG. 2) for transmission to the DRAM memory unit 44 (FIG. 1). This signal is used for clocking the CAS address bits into the memory unit 44 in a manner that is well known in the art.

Figure 5C:
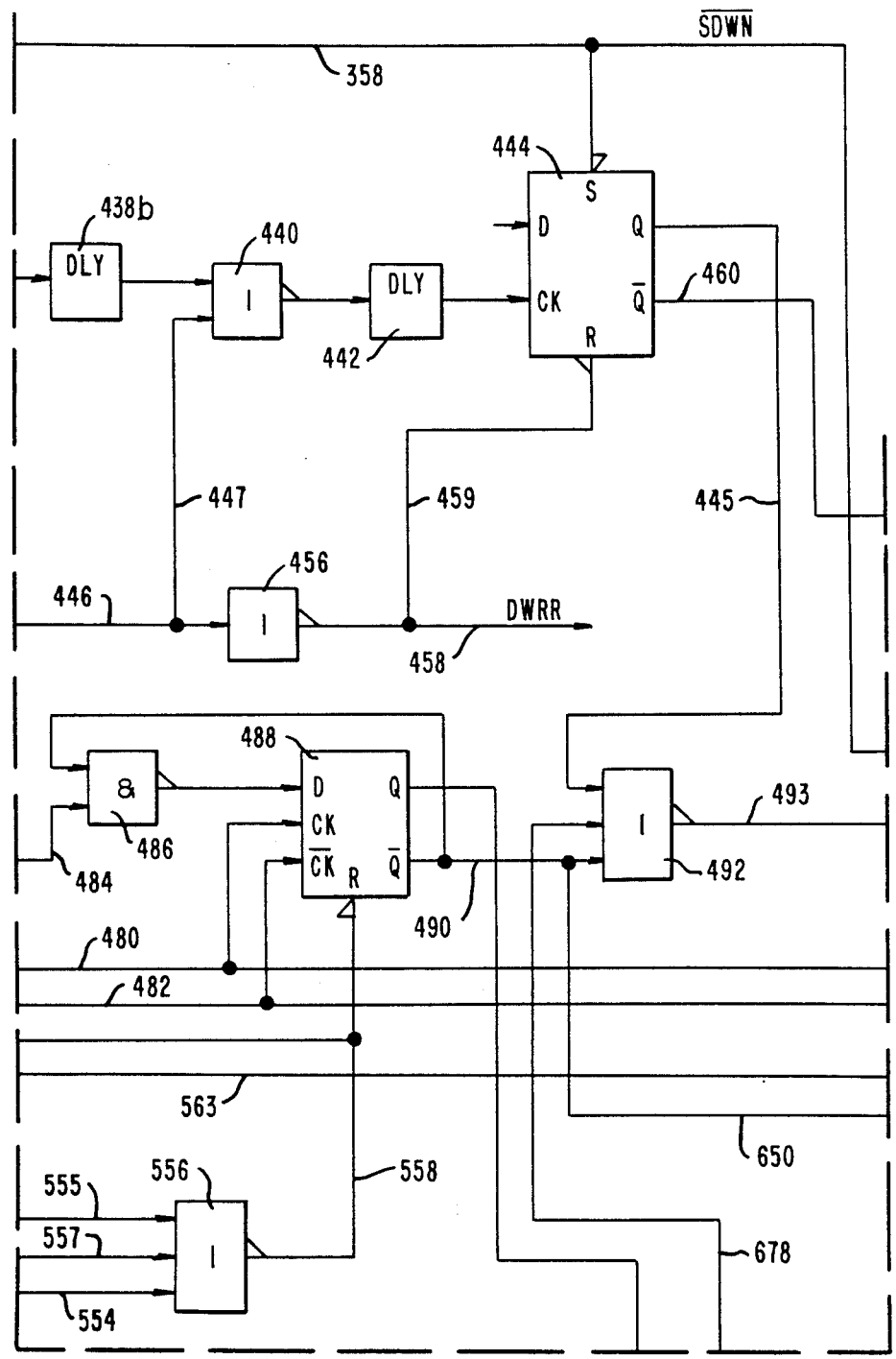
Figure 5D:
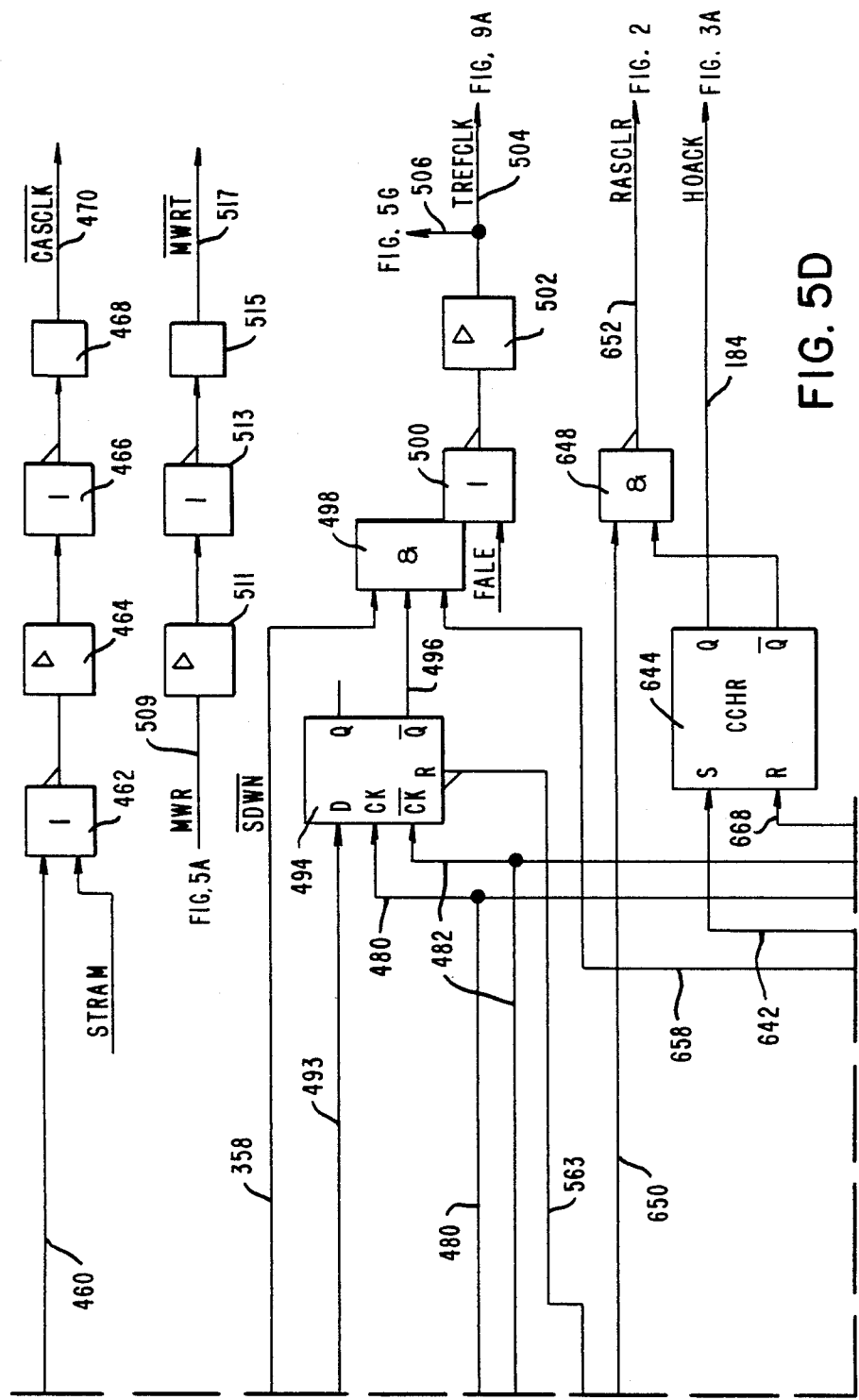

The high signal appearing on the Q output line 428 of the flip-flop 420 (FIG. 5A) is transmitted over line 472 (FIG. 5B) to the D input of a D-type flip-flop 474. The clock input signal to the flip-flop 474 is derived from the bus clock signal CLCKB appearing on the input line 152 (FIG. 5A) from the microprocessor interface unit 28 (FIG. 3A). This signal is inputted into a clock driver 476 (FIG. 5A) which outputs over line 480 the clock signal CLKB1 and over line 482 the inverted clock signal CLKB2 which signals are inputted into the flip-flop 474 (FIG. 5B) thereby clocking the flip-flop. The clocking of the flip-flop 474 will output a signal over its Q/ output line 484 to a NAND gate 486 (FIG. 5C) which outputs a high signal to the D input of the D-type flip-flop 488. The flip-flop 488 is clocked by the clocking signals appearing on the input lines 480 and 482 enabling the flip-flop to output a low signal over its Q/ output line 490 to one input of a NOR gate 492 which, when enabled, outputs a signal over line 493 to the D input of a D-type flip-flop 494 (FIG. 5D). The flip-flop 494 is again clocked by the clocking signals CLKB1 and CLKB2 appearing on the input lines 480 and 482 to output a clock signal over its Q/ output line 496 to an AND gate 498 whose output signal is inputted into a NOR gate 500. The NOR gate 500 will output the transparent refresh clock signal TREFCLK through the buffer 502 and over line 504 to the refresh control unit 90 (FIG. 2) for use in a transparent refresh operation of the DRAM memory unit 44 (FIG. 1) as will be described more fully hereinafter. This signal is transmitted over bus 75 (FIG. 1) to the DRAM RAS decode unit 76 (FIG. 2) to generate a RAS clock which is transmitted to the memory unit 44 (FIG. 1) for terminating a transparent refresh operation and also transmitted over line 506 as a reset signal (FIG. 5G).

The write signal WR appearing on line 216 (FIG. 5A) is inputted over line 501 to one input of the NAND gate 503 (FIG. 5A) which also receives the bus memory request signal MREQB over input line 250. The low memory write signal MWR outputted by the NAND gate 503 is transmitted over line 505, through the NAND gate 507 and over line 509 to the buffer 511 (FIG. 5D), through the inverter 513, the connecting pad 515 and over the system bus output line 517 as the low memory write signal MWRT/.

Figure 5E:
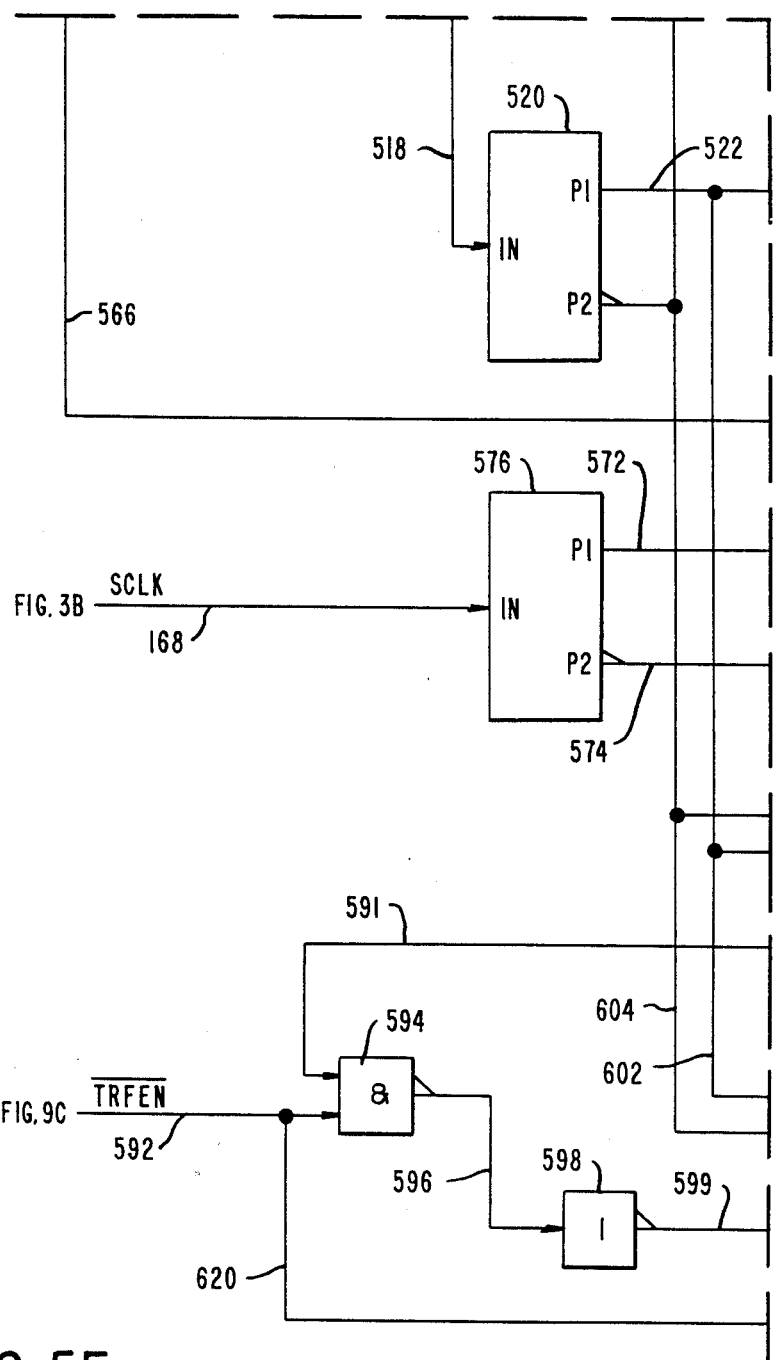
Figure 5F:
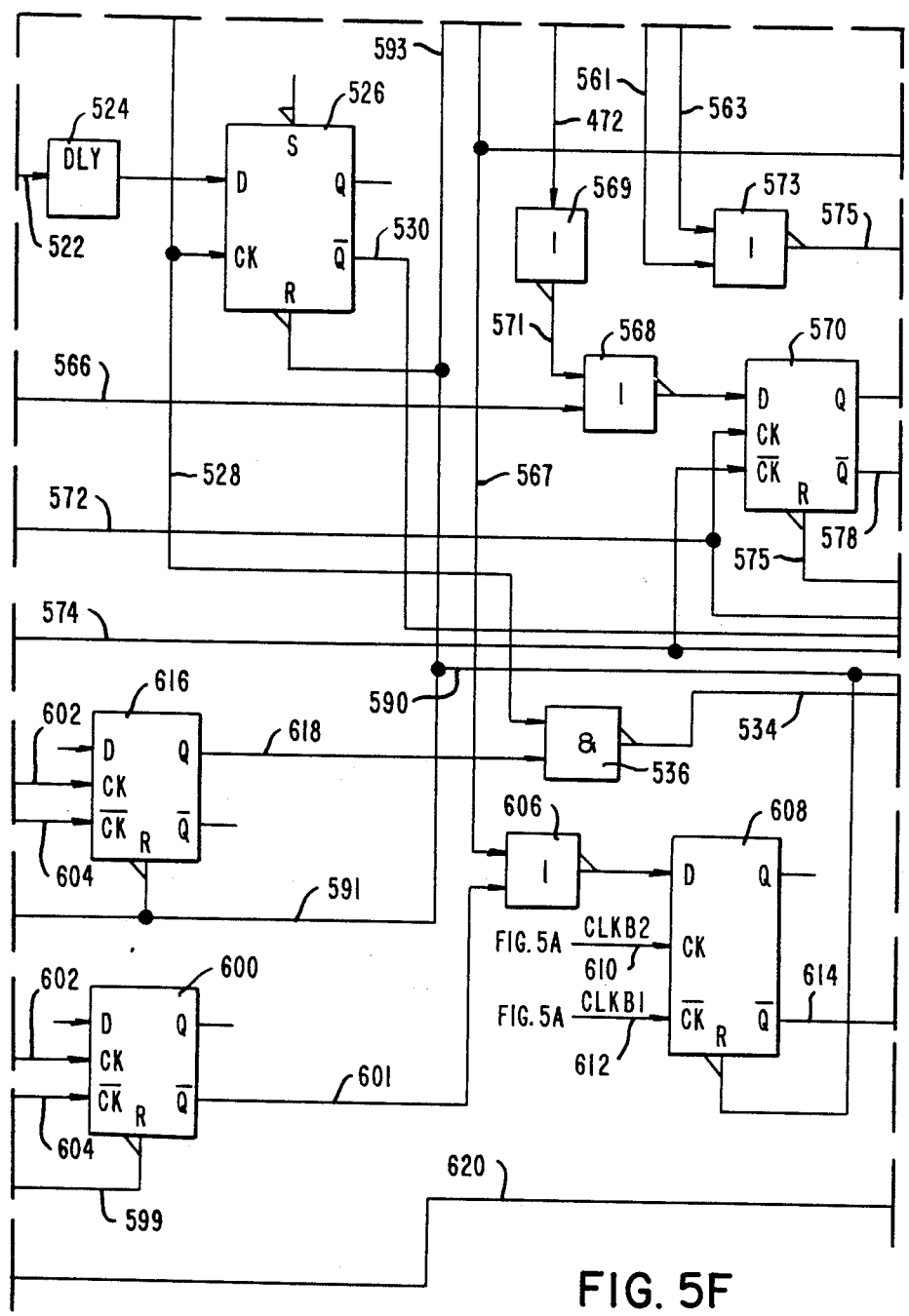
Figure 5G:
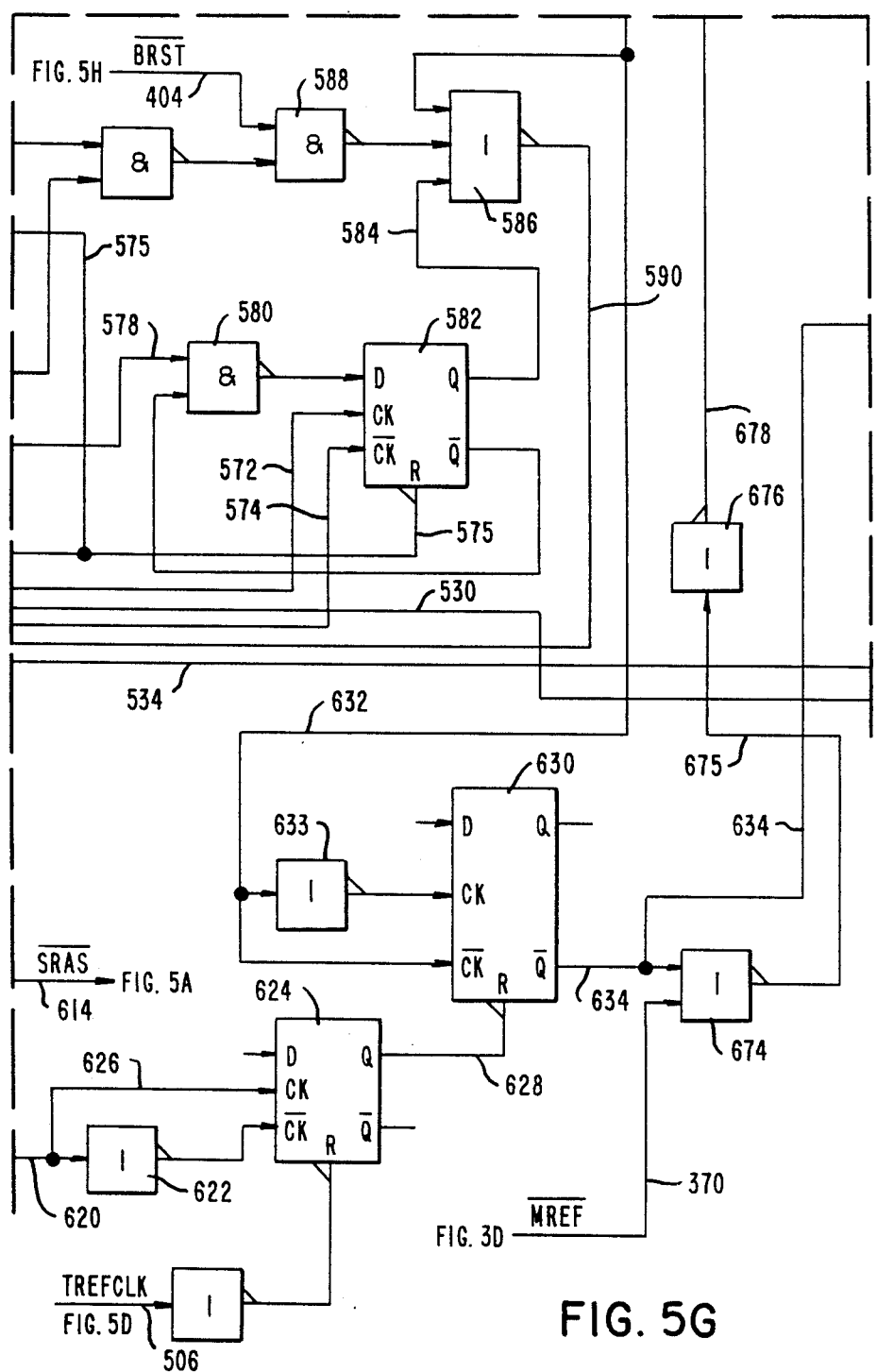

When a refresh operation is to occur, the refresh control circuit 90 (FIG. 2) will output the refresh request signal REFREQ (FIG. 5A) over line 866 to the D input of a D-type flip-flop 512 which also receives the clock signals CLCKB1 and CLCKB2 over lines 514 and 516 respectively enabling the flip-flop 512 to output over its Q output line 518 a clocked signal to the buffer driver 520 (FIG. 5E). The driver 520 will output signals over line 522 to a delay circuit 524 (FIG. 5F) and from there to the D input of the D flip-flop 526. The flip-flop 526 is clocked by the rising edge of the memory request signal MREQ appearing on line 248 (FIG. 5A) and which is transmitted over line 528 to the clock input of the flip-flop 526. The clocking of the flip-flop 526 results in a low signal appearing on its Q/ output line 530 which is transmitted to one input of a NAND gate 532 (FIG. 5H) which also receives the memory request signal MREQ appearing on line 534 and outputted from a NAND gate 536 (FIG. 5F).

The NAND gate 532 (FIG. 5H) also receives an input signal IOSRDY appearing on the input line 538 and transmitted from the interface unit 62 (FIG. 2) for synchronizing the clock speed of the microprocessor with the system bus access cycle speed as will be described more fully hereinafter. The NAND gate 532 outputs the bus ready signal BRDY over line 540 through the buffer 542 to the open drain output driver represented by the numeral 544 which outputs the signal through the connecting pad 548 and out over the line 550 to the microprocessor 20 (FIG. 2). If the signal BRDY is active high, the system bus 40 (FIG. 1) is ready for the current machine cycle. If the signal goes low, the accessing device will extend its machine cycle until the signal BRDY goes active high.

As previously described, the microprocessor interface unit 62 (FIG. 2) will output over line 194 (FIG. 3B) the DMA acknowledge signal BDAK/ (FIG. 5A) indicating that a requesting DMA device has been given control of the system bus. As will be described more fully hereinafter, a transparent refresh operation of the DRAM memory unit 44 (FIG. 2) cannot occur when the DMA device has control of the system bus. Since a refresh operation must occur approximately every 30 microseconds, the DMA device is required to relinquish the system bus prior to the elapse of 28.5 microseconds from the initiation of the DMA cycle to allow a contention refresh operation to occur. This condition degrades the overall performance of the processing system. The BDAK/ signal appearing on line 194 is transmitted through the inverter 552 (FIG. 5A) and over line 554 to a NOR gate 556 (FIG. 5C) whose low output signal over line 558 will reset the flip-flops 474 (FIG. 5B) and 488 (FIG. 5C).

The NOR gate 556 (FIG. 5C) also receives over line 557 the high reset signal BRST appearing on line 404 (FIG. 5A) and which is transmitted through the inverter 551. This signal is also transmitted over line 557, through the NOR gate 560 (FIG. 5B) and over line 563 to reset the flip-flop 494 (FIG. 5D) and over line 565 to reset the flip-flop 432 (FIG. 5B). The NOR gate 556 (FIG. 5C) also receive the low memory request signal MREQ appearing on the input line 555 and outputted from the NOR gate 559 (FIG. 5B) which receives the signal MREQ over lines 248, 528 (FIG. 5A) and 529 (FIG. 5B). The NOR gate 560 (FIG. 5B) also receives over line 562 the memory request signal MREQ (FIG. 5A) which is transmitted over lines 248, 528 and inverted by the inverter 564. The low MREQ signal enables the NOR gate 560 to transmit an active low reset signal over lines 563 and 565.

The DMA acknowledge signal BDAK/ appearing on the input line 194 (FIG. 5A) is also transmitted over line 566 to one input of a NOR gate 568 (FIG. 5F). The gate 568 also receives the output signal of the flip-flop 420 (FIG. 5A) which is transmitted over lines 428 and 472, through the inverter 569 and over line 571 to the NOR gate 568. The output signal of gate 568 is inputted into the D-type flip-flop 570. The flip-flop 570 is clocked by clocking signals appearing on input lines 572 and 574 which are received from the clock driver 576 (FIG. 5E) in response to receiving over line 168 (FIG. 3B) the system clock signal SCLK from the microprocessor interface unit 62 (FIG. 2). The clocking of the flip-flop 570 terminates the RASCLK signal to the DRAM memory unit 44 allowing a RAS precharge to occur in the memory unit prior to the next access cycle in a manner that is well known in the art.

The clocking of the flip-flop 570 (FIG. 5F) will output a low signal over its Q/ output line 578 through the NAND gate 580 (FIG. 5G) to the D input of the D-type flip-flop 582 which is also clocked by the signals appearing on the input lines 572 and 574. The clocking of the flip-flop 582 (FIG. 5G) will output a high signal over line 584 to one input of the NOR gate 586 (FIG. 5G). The gate 586 also receives from the NAND gate 588 the bus reset signal BRST/ appearing on line 404 and which is transmitted through the NAND gate 588. The NOR gate 586, when enabled, will output over lines 590 and 593 a reset signal for resetting the flip-flop 420 (FIG. 5A) terminating the signal RASCLK in a manner to be described more fully hereinafter. The flip-flops 570 (FIG. 5F) and 582 (FIG. 5G) are reset by the bus reset signal BRST appearing over lines 557 (FIGS. 5A and 5B), 561 (FIGS. 5B and 5F), through the NOR gate 573 (FIG. 5F) and over line 575 to the inverted reset input of the flip-flops 570 (FIG. 5F) and 582 (FIG. 5G). The NOR gate 573 is controlled by the low memory request signal MREQ/ (FIG. 5A) which is transmitted over lines 248, 528, through the NOR gate 559 (FIG. 5B) and lines 555 and 563.

Appearing on the input line 592 (FIG. 5E) is the transparent refresh enable signal TRFEN/ which is outputted from the refresh control circuit 90 (FIG. 2) in a manner to be described more fully hereinafter. This signal is transmitted through the NAND gate 594 (FIG. 5E) which also receives at its other input the reset signal appearing on line 591 in the manner described previously. The NAND gate 594 will output the reset signal over line 596 through the inverter 598 and over line 599 to the reset input of a flip-flop 600 (FIG. 5F). The flip-flop 600 has been clocked by the clock signals appearing on the input lines 602 and 604 which are outputted from the clock driver 520 (FIG. 5E) in response to the generation of the refresh request signal REFREQ appearing on the input line 518 (FIG. 5A) going low. The clocking of the flip-flop 600 will output a signal over the Q/ output line 601 to one input of the NOR gate 606 whose other input will receive the inverted memory request signal MREQ/ which appears on line 567 (FIGS. 5B and 5F). The output signal of gate 606 will be inputted into the D input of a D-type flip-flop 608. The flip-flop 608 is clocked by the processor clocking signal CLKB2 appearing on the input line 610 (FIG. 5A) and CLKB1 appearing on the input line 612. The clocking of the flip-flop 608 will output on its Q/ output the system row address strobe SRAS/ over line 614 to the flip-flop 420 (FIG. 5A) setting the flip-flop and thus starting a memory access cycle at the termination of a contention refresh cycle as will be described more fully hereinafter. The clocking signals appearing on lines 602 and 604 (FIG. 5E) will also clock a flip-flop 616 (FIG. 5F) whose output signal appearing on line 618 is transmitted to the NAND gate 536 enabling the NAND gate to transmit the memory request MREQ appearing on the input line 528 to the NAND gate 532 (FIG. 5H) as described previously.

The refresh enable signal TRFEN/ appearing on the input line 592 (FIG. 5E) is also transmitted over line 620 (FIG. 5E) and through an inverter 622 (FIG. 5G) to the inverted clock input of a D-type flip-flop 624 which also receives over line 626 the signal TRFEN/. The clocking of the flip-flop 624 when the signal TRFEN goes active low will output a signal over line 628 to remove the reset input signal of the flip-flop 630. The flip-flop 630 receives clock signals outputted by the flip-flop 488 (FIG. 5C) over line 632 and through the inverter 633 thereby clocking the flip-flop at the time the signal RASCLK is reset as described previously. The clocking of the flip-flop 630 will enable its Q/ output signal to appear on line 634 which is transmitted through the NOR gate 636 (FIG. 5H) whose output signal is transmitted over line 638 to the D input of a D type flip-flop 640. The output signal from the NOR gate 636 is also transmitted over line 642 to the set input of a cross-coupled NOR gate 644 (FIG. 5D). The setting of the gate 644 will output over its Q output line 184 the hold off acknowledge signal HOACK which is transmitted to the microprocessor interface unit 62 (FIGS. 2 and 3A) for enabling a transparent refresh operation to occur in a manner to be described hereinafter. The Q/ output signal of the NOR gate 644 is transmitted through the NAND gate 648 which receives the output signal from the flip-flop 488 (FIG. 5C) over line 650. The row address strobe clear signal RASCLR appearing on the output line 652 of the NAND gate 648 is transmitted to the DRAM address multiplexer unit 80 (FIG. 2) for multiplexing the refresh address bits to the DRAM memory unit 44 (FIG. 1) over the MA0-MA8 lines of bus 42 (FIG. 1).

The bus hold acknowledge signal BHLDA appearing on the input line 414 (FIGS. 5H and 3E) is inputted to one input of the NAND gate 654 whose other input receives a signal over line 657 from the flip-flop 640. The output signal of the NAND gate 654 is transmitted over line 658 to one input of the NAND gate 498 (FIG. 5D) enabling the transparent refresh clock signal TREFCLK to be outputted over line 504 for controlling a transparent refresh operation prior to the requesting DMA device receiving control of the system bus 40 as will be described more fully hereinafter. The signal appearing on the output line 656 of the flip-flop 640 (FIG. 5H) is also inputted into one input of the NAND gate 660 whose output signal over line 662 is inputted into one input of the NAND gate 664. The NAND gate 664 also receives the bus reset signal BRST/ appearing on input lines 666 and 667 (FIG. 5A) enabling the NAND gate 664 to output a reset signal over line 668 which resets the flip-flop 644 (FIG. 5D). The reset signal BRST/ is also transmitted over line 670 to one input of the NAND gate 672 (FIG. 5H) whose high output signal is transmitted through the inverter 674 to the reset input of the flip-flop 640. The NAND gate 672 will also output a high signal upon receiving the low inactive signal BHLDA appearing on its input line 676.

The microprocessor interface unit 62 (FIG. 2) will output over line 370 (FIG. 5G) the memory refresh signal MREF/ which is transmitted through the NOR gate 674 (FIG. 5G), over line 675, through the inverter 676 and over line 678 to the NOR gate 492 (FIG. 5C) enabling the flip-flop 494 (FIG. 5D) to receive the output signal from the flip-flop 488 which is transmitted through the NOR gate 492 and over line 493. The clocking of the flip-flop 494 results in the generation of the clock signal TREFCLK over line 504 which initiates a transparent refresh operation. The NOR gate 492 also receives over its input line 445 the Q output timing signal of the flip-flop 444. When a power down condition appears, the power down detect signal SDWN appears on input line 942 (FIG. 5A) and the inverted power down detect signal SDWN/ appears on input line 358. The signal SDWN/ is transmitted over line 945 to the gate 507 making the memory write signal MWR go high which puts the MCC interface unit 28 (FIG. 1) into a low power condition. The signal SDWN/ appearing on line 358 sets the flip-flop 444 (FIG. 5C) and enables the NAND gate 498 (FIG. 5D) to generate the active high clock signal TREFCLK.

Figure 7A:
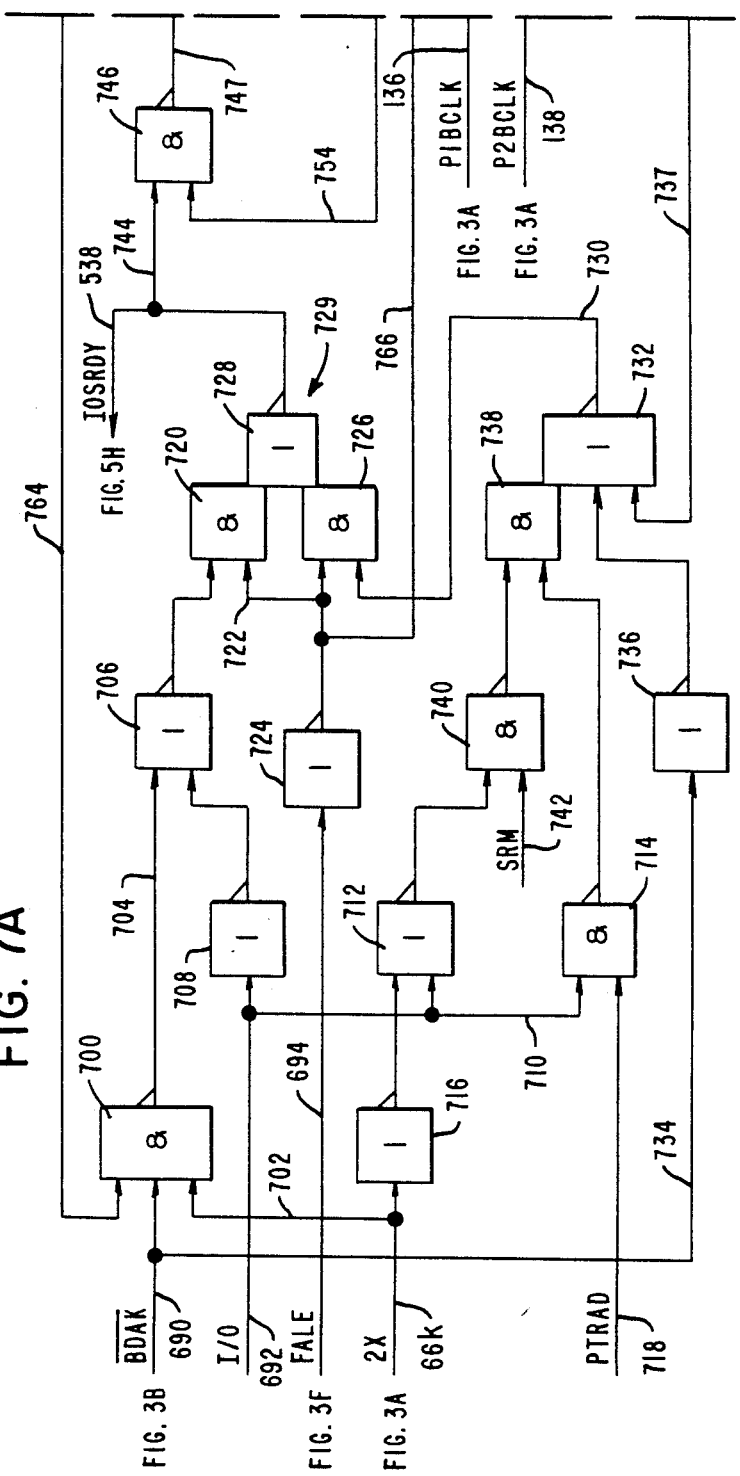

Referring now to FIG. 7A and 7B, there is disclosed a detailed schematic diagram of a portion of the logic circuits in the interface unit 62 (FIG. 2) for generating a timing signal which forces the microprocessor 20 into a delay or wait period. As previously described, the microprocessor 20 (FIG. 1) may operate at a clock frequency of either 4.608 MHz or 2.304 MHz. In most cases, the microprocessor 20 is operating at $2\times$ speed or 4.608 MHz. While the microprocessor is operating at this latter speed, the peripheral devices such as the disc file 56 (FIG. 1) or the remote terminal interface 61 are operating at the system bus speed of 2.306 MHz. In order for the microprocessor 20 to operate with respect to the remote peripheral devices, the circuitry in FIG. 7A and 7B generates a plurality of wait periods in which the microprocessor will refrain from completing the transfer of data to or from the peripheral devices until it is synchronized with the operating speed of such peripheral devices.

As shown in FIG. 7A, appearing on the input lines 690 and 692 which form part of the bus 101 (FIG. 1 and FIG. 2) are control signals outputted by the microprocessor interface unit 62 (FIG. 2). Appearing on the input line 690 is the DMA acknowledge signal BDAK/ which is active low when the requesting DMA device is given control of system bus 40 for access to the DRAM memory unit 44 (FIG. 1). Under this condition, no wait periods are required to be generated since the microprocessor 20 is not involved in the operation and the active low signal BDAK/ will disable the operation of the circuitry disclosed in FIGS. 7A and 7B. The signal BDAK/ is inputted into one input of the NAND gate 700. Appearing on a second input of the NAND gate 700 is the memory speed signal 2X which, when active high, indicates that the microprocessor 20 is operating at twice the system clock speed or 4.608 MHz. If the signal 2X is low, the microprocessor 20 is operating at the system bus speed of 2.304 MHz. The signal 2X is transmitted over lines 66k and 702 through the NAND gate 700 and over line 704 to one input of the NOR gate 706 which also receives the input/output signal I/0 appearing on line 692 and transmitted through the inverter 708 to the NOR gate 706. The signal I/0 appearing on line 692 is also transmitted over line 710 to one input of the NOR gate 712 and one input to the NAND gate 714. The NOR gate 712 also receives the 2X signal appearing on line 66k which is inverted by the inverter 716 while the NAND gate 714 receives the printer address signal PTRAD appearing on input line 718. The output signal of the NOR gate 706 is inputted into one input of a NAND gate 720 which also receives over input line 722 the fast address latch enable signal FALE appearing on input line 694 which is transmitted through the inverter 724 for input into the NAND gate 720 and a second NAND gate 726 whose output signals are inputted into the NOR gate 728. The gates 720, 726 and 728 form a multiplexer indicated by the numeral 729 for selecting the input signal to the NAND gate 746 and the I/0 ready signal IOSRDY.

The AND gate 726 (FIG. 7A) also receives on line 730 the output signal of a NOR gate 732 which receives on its input line 734 the signal BDAK/ which is transmitted through the inverter 736. The gate 732 receives on its other input line 737 the clocked output signal of a flip-flop 756 (FIG. 7B) indicating the termination of one wait period. The NOR gate 732 also receives the output signal of an AND gate 738 which has one input connected to the output of the NAND gate 714 through which the signal PTRAD is transmitted. The other input of the gate 738 is connected to the output of a NAND gate 740 which receives the signal 2X from the output of the NOR gate 712 and the static RAM signal SRM appearing on input line 742. When the totals RAM unit 114 (FIG. 2) is being accessed, the signal SRM will be active high.

The I/0 ready signal IOSRDY outputted by the NOR gate 728 (FIG. 7A) is transmitted over line 744 to one input of the NAND gate 746 and also over line 538 (FIG. 5H) to the DRAM timing control circuit 72 (FIG. 2) where it controls the insertion of a wait period into the microprocessor machine cycle by delaying the generation of the bus ready signal BRDY. The output signal of the NAND gate 746 is inputted over line 747 into the D input of a D-type flip-flop 750 (FIG. 7B) which is part of a counter for generating wait periods. The flip-flop 750 is clocked by the clock signal P1BCLK appearing on input line 136 (FIG. 3A) and its inverted clock signal P2BCLK appearing on input line 138 which are transmitted from the microprocessor interface unit 62 (FIG. 2). The clocking of the flip-flop 750 will output a high signal from its Q output over line 752 to the D input of a second D-type flip-flop 756 which is also clocked by the clocking signals P1BCLK and P2BCLK. The Q/ output signal of the flip-flop 750 appears on line 754 (FIGS. 7A and 7B) and disables the NAND gate 746 (FIG. 7A) to latch the flip-flop 750 into a set state until its reset by the signal FALE going high.

The clocking of the flip-flop 756 (FIG. 7B) will output a high signal over line 758 through the buffer 760 to the D input of a D-type flip-flop 762 which, when clocked by the signals P1BCLK and P2BCLK, will output a low signal over its Q/ output line 764 to the NAND gate 700 (FIG. 7A), disabling the gate. The disabling of the NAND gate 700 disables the multiplexer 729 which enables the signal IOSRDY to go high, thus providing two wait periods during a 2x speed I/0 read or write cycle. The flip-flops 750, 756 and 762 are reset by the inverted signal FALE appearing on line 766 (FIGS. 7A and 7B).

Referring now to FIGS. 9A-9H inclusive, there are shown the logic circuits found in the refresh control unit 90 (FIG. 2) which generates the clock signals for initializing a contention refresh operation and a transparent refresh operation. The refresh control unit 90 provides one of 512 refresh addresses to the DRAM address multiplexer 80 at all times. Under normal operations, the DRAM memory unit 44 (FIG. 1) will have one row address refreshed by the clock signals generated in the refresh control unit 90 every time a 28 microseconds period has elapsed. If during a normal operation, a transparent refresh operation has not occurred during the last 20 to 22 microseconds, a contention refresh operation will be initiated. The present invention allows the MCC interface unit 28 (FIG. 1) to complete a transparent refresh operation of the DRAM memory unit 44 prior to allowing a DMA device access to the system memory bus. If a DMA device has control of the system bus, the MCC interface unit 28 is prohibited from generating a transparent refresh operation. Since a DMA device may take a disproportionate amount of time on the system bus in carrying out its access operation and a contention refresh operation has to occur after a period of 23 microseconds has elapsed since the last refresh operation, the present invention enables the MCC interface unit 28 to complete a transparent refresh operation of the memory unit 44 prior to the time the system bus is turned over to the requesting DMA device.

Figure 9A:
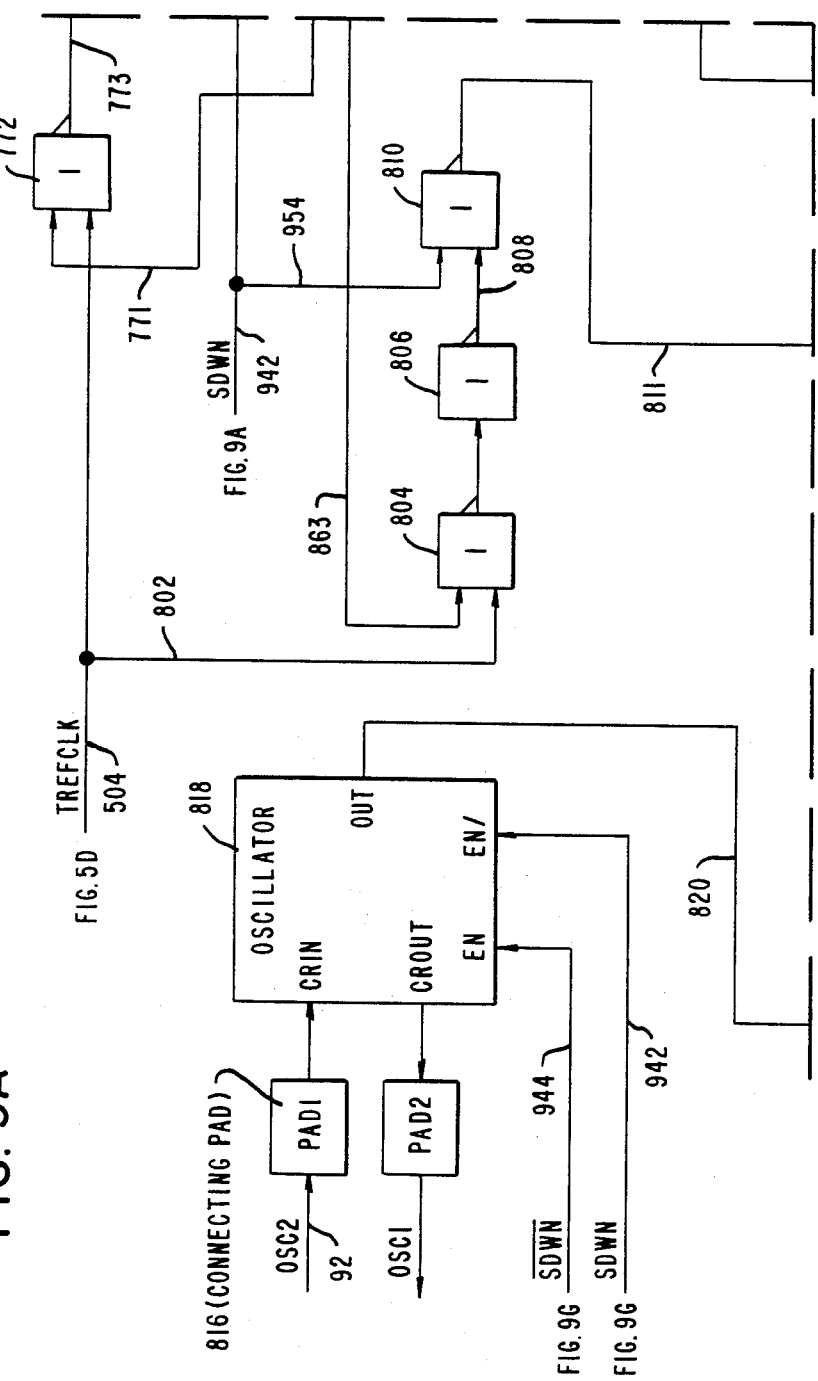

Referring now to FIG. 9A, the high transparent refresh clock signal TREFCLK generated by the DRAM timing control- circuit 72 (FIGS. 2 and 5D) indicating the start of a transparent refresh operation, will appear on line 504 which is inputted into one input of a NOR gate 772 which also receives a high signal over input line 771. The low output signal of gate 772 is transmitted over line 773 through the inverter 774 (FIG. 9B) and over line 775 to the clock input of a D-type flip-flop 766a which is part of a refresh address counter generally indicated by the numeral 777 (FIG. 9B) comprising the flip-flop 766a-766i inclusive (FIGS. 9B and 9C). The signal TREFCLK is also transmitted over line 778 to the inverted clock input of the flip-flop 766a. The clocking of the flip-flop 766a will output a refresh address signal RFA0 on line 780 which clocks the next flip-flop 766b. The signal RAF0 is also transmitted over bus 800 to the DRAM address multiplexer 80 (FIG. 2) which indicates the next address in the DRAM memory unit 44 that is to be refreshed in a manner that is well known in the art. As each succeeding flip-flop 766b-766h inclusive (FIGS. 9B and 9C) is clocked, the corresponding refresh address signals RFA1-RFA8 are transmitted over the output bus 800 for indicating the next address in the memory unit 44 that is to refreshed.

The TREFCLK signal appearing on line 504 is also transmitted over line 802 to the NOR gate 804 which also receives the transparent refresh counter clear signals CNTRF-CLR on the input line 863. The gate 804 will output a low signal to the inverter 806 and over line 808 to one input of the NOR gate 810 whose other input receives the power down signal SDWN over line 954 which is low at this time.

Figure 9D:
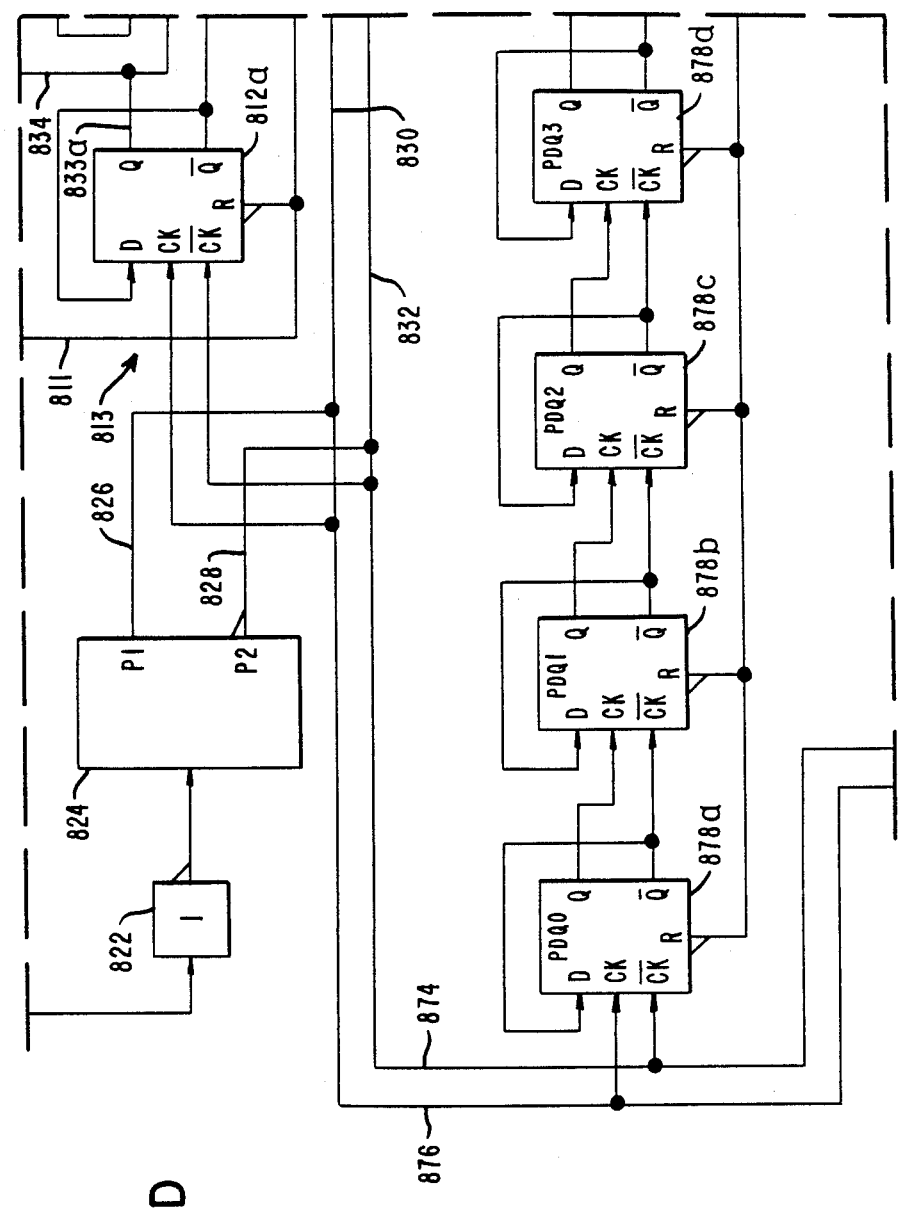
Figure 9E:
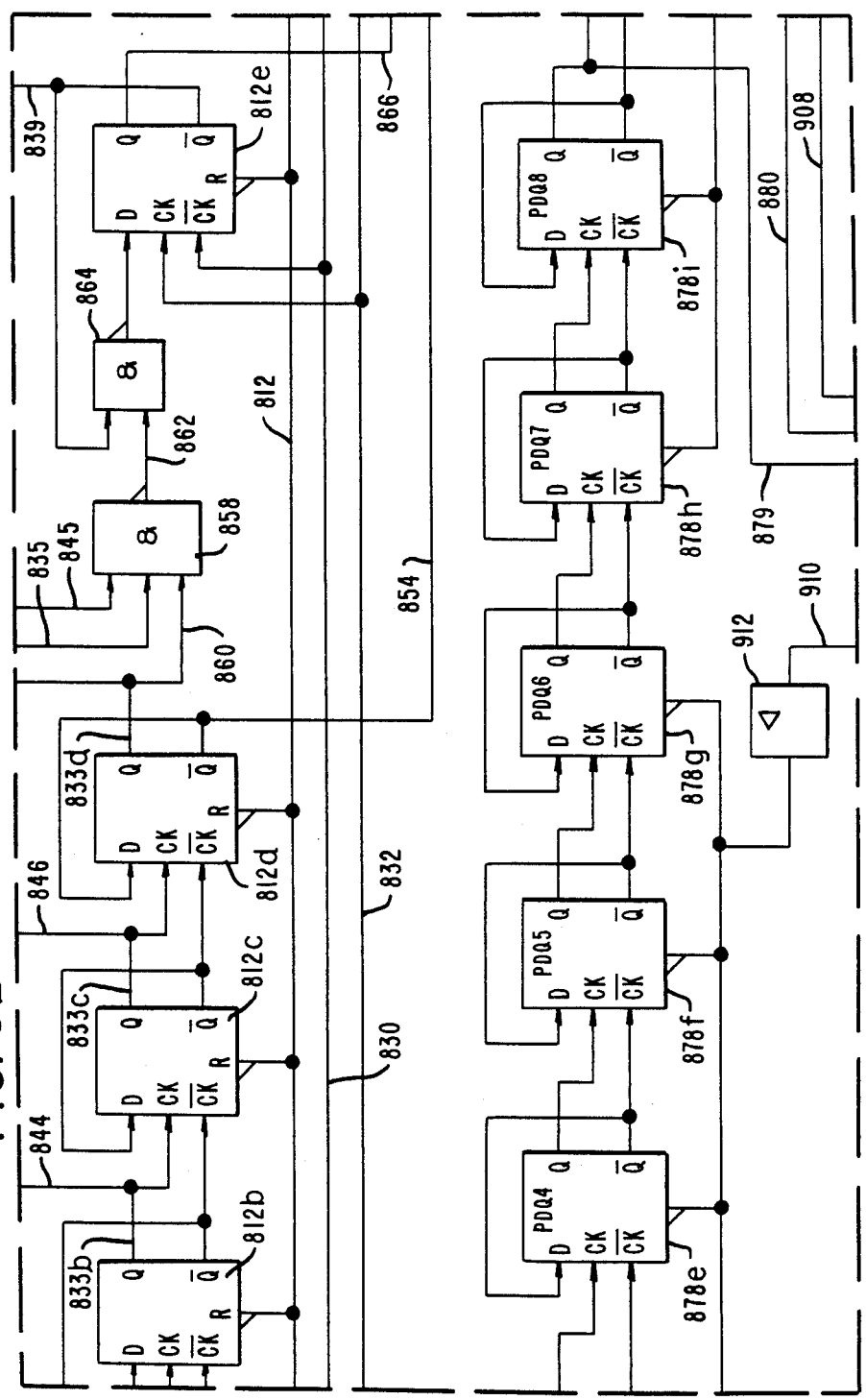
Figure 9F:
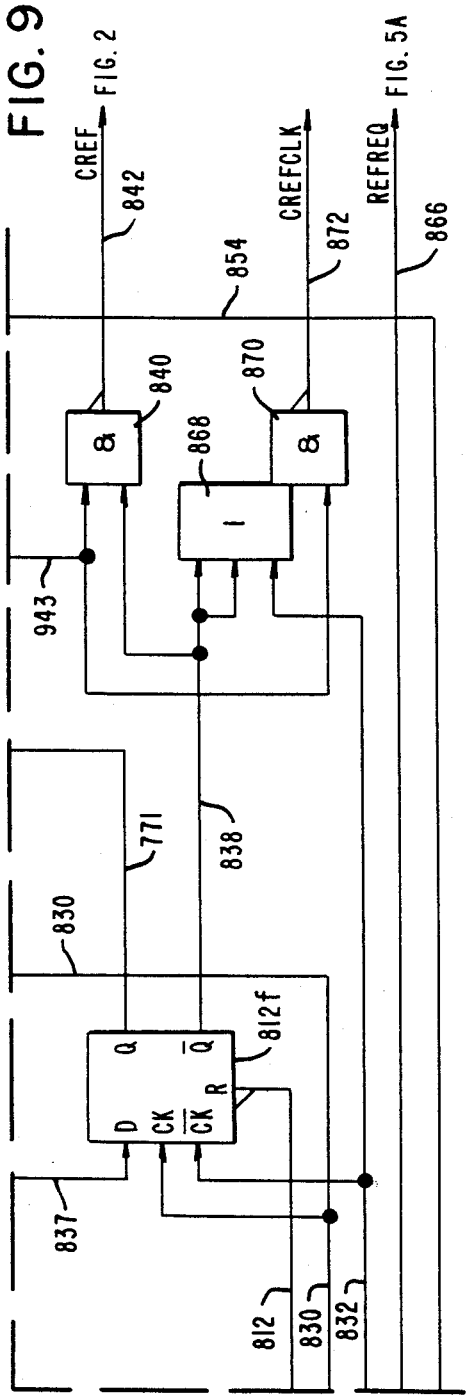
Figure 9F:
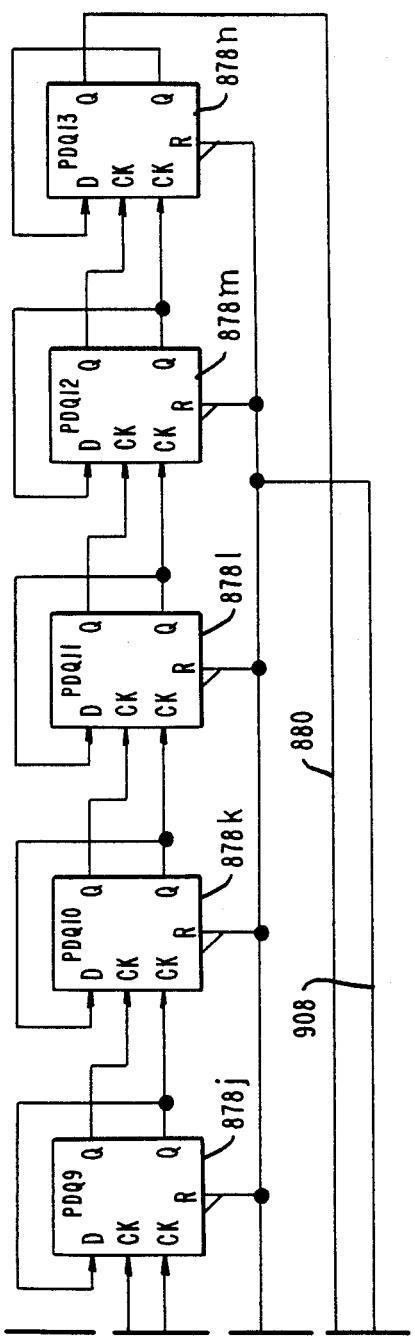
Figure 9G:
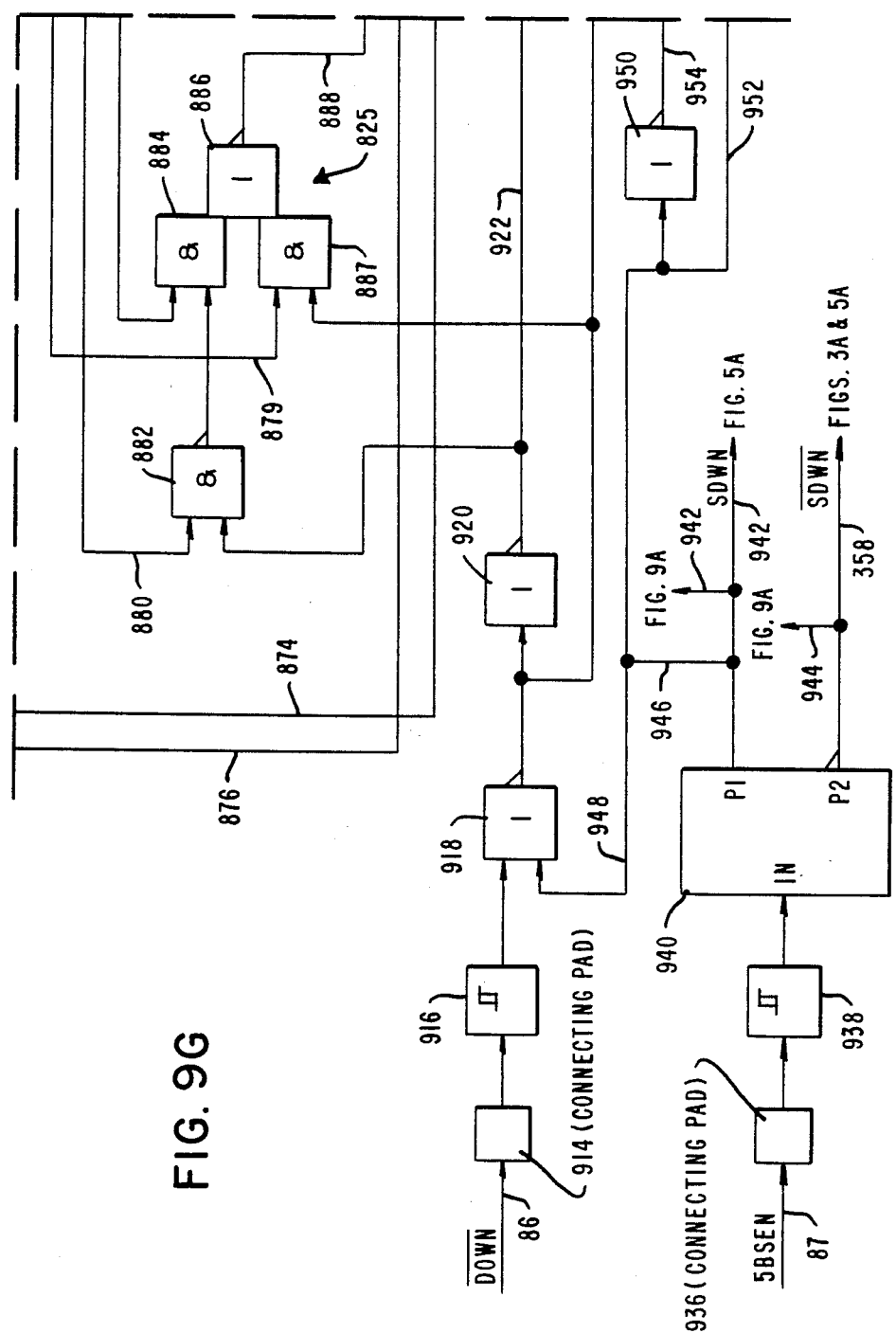

The high TREFCLK signal outputted by the NOR gate 810 at the start of a transparent refresh operation is transmitted over line 811 to the reset input of a contention refresh counter generally indicated by the numeral 813 (FIG. 9D) which includes a plurality of D-type flip-flop 812a-812f inclusive (FIGS. 9D-9F inclusive). The flip-flops 812a-812d inclusive comprise the contention refresh counter 813 which times out approximately 28 microseconds after the last refresh operation has occurred. The flip-flops 812e and 812f latch the output of the counter 813. The flip-flops of the counter 813 are clocked by the oscillator signals OSC2 appearing on input line 92 (FIG. 9A) which is coupled through a connecting pad 816 to an oscillator circuit 818 which outputs over line 820 the 500 Khz clock signals which are inverted by the inverter 822 and outputted to the clock driver 824 which in turn outputs clock signals on lines 826 and 828.

The clocking signals appearing on lines 826 and 828 are transmitted over lines 830 and 832 respectively to the clock inputs in the flip-flop 812a. As stated previously, the flip-flops 812a-812f inclusive are reset at the start of a transparent refresh operation by the TREFCLK signal. Clocking of the flip-flop 812a will output a clocking signal RFTMO over line 833a to the next flip-flop 812 and also over line 834 which is transmitted to one input of the NOR gate 836 (FIG. 9C) whose high output signal is transmitted over line 837 to the D input of the flip-flop 812f (FIG. 9F). The NOR gate 836 also receives the Q/ output signal from the flip-flop 812e (FIG. 9E) over line 839. The flip-flop 812f is clocked by the clock signals appearing on lines 830 and 832 to output a clocking signal over its Q output line 838 to one input of NAND gate 840 which also receives the shut down signal SDWN (FIG. 9A) over line 943. The gate 840 outputs the high contention refresh signal CREF over line 842 to the DRAM address multiplexer 80 (FIG. 2) which causes the multiplexing of the refresh address signal RAF0-FAF8 appearing on bus 800 (FIGS. 9B and 9C) to be transmitted to the DRAM memory unit 44 over lines MA0-MA8 inclusive of bus 42 (FIG. 1). This result occurs only during a contention refresh operation.

The clocking of the flip-flops 812b and 812c (FIG. 9B) results in clock signals RFTM1 and RFTM2 (FIG. 9B) appearing on lines 833b and 833c for clocking flip-flops 812c and 812d respectively. These signals also appear on lines 844 and 846 which are connected by lines 848 and 850 to a NAND gate 852 (FIG. 9C) which also receives over line 854 the Q/ output signal from the flip-flop 812d representing the time-out of the counter 813. When enabled, the NAND gate 852 will output over line 856 the transparent refresh enable signal TRFEN/ to the DRAM timing control circuit 72 (FIG. 5E) for initiating a transparent refresh operation within 10–12 microseconds of the last refresh operation.

The timing signals RFTM0 and RFTM1 appearing on lines 834 and 844 respectively are also transmitted over lines 835 and 845 to a NAND gate 858 (FIG. 9E) which also receives the Q output signal of the flip-flop 812d appearing on line 860. When enabled, the gate 858 will output a low signal over line 862 to a NAND gate 864 whose high output signal is inputted into the D input of the flip-flop 812e. Clocking of the flip-flop 812e results in the refresh request signal REFREQ appearing on its Q output line 866 which is transmitted to the DRAM timing control circuit (72 FIG. 5A) for initiating a refresh operation. This action occurs 20–22 microseconds after the last refresh operation.

The clocking of the flip-flop 812f (FIG. 9F) by the clocking signals appearing on lines 830 and 832 results in the Q/ output signal appearing on line 838 being inputted into an OR gate 868 which also receives the clock signals appearing on line 832. The output signal of the OR gate 868 is inputted into a NAND gate 870 which outputs the high contention refresh clock signal CREFCLK on line 872 for transmission to the DRAM RAS decode unit 76 (FIG. 7) for clocking the address signals into the DRAM memory unit as part of a contention refresh operation. This signal occurs 24–26 microseconds (FIG. 12) after the last refresh operation.

Figure 9H:
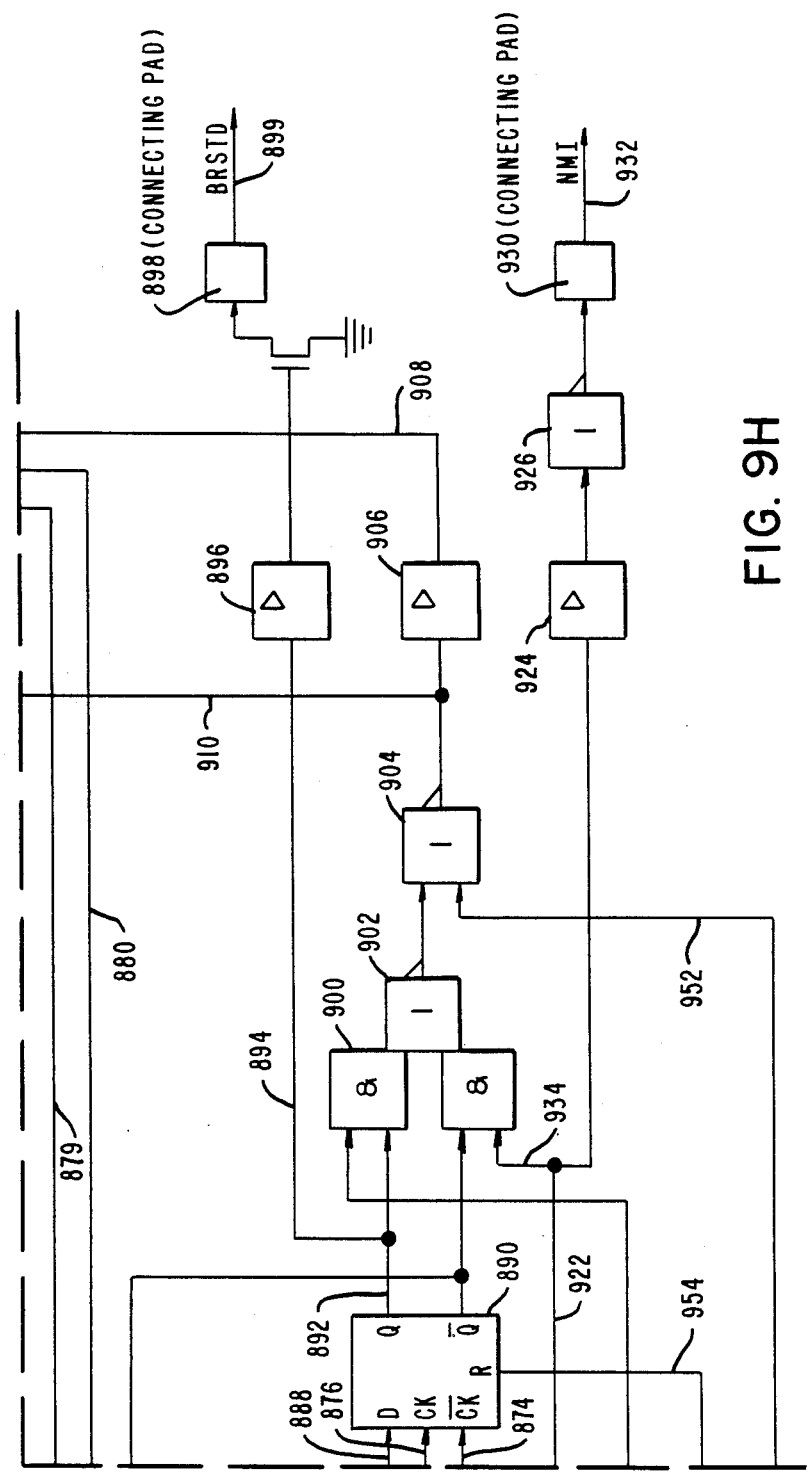

The clock signals appearing on line 830 and 832 (FIG. 9B) are also transmitted over lines 874 and 876 to the clock inputs of a flip-flop 878a (FIG. 9D). The clocking of the flip-flop 878a will output a signal which ripples through a plurality of flip-flops 878b–878n inclusive (FIGS. 9D, 9E and 9F) representing a counter for generating a timing period during which a power up or a power down operation of the system occurs. The clocking of the flip-flop 878n generates a timing signal on its Q output line 880 which is transmitted through the NAND gate 882 (FIG. 9G) to one input of a multiplexer indicated by the numeral 885. The multiplexer 885 includes the AND gate 884, the AND gate 887 and the NOR gate 886 whose high output signal is transmitted over line 888 to the D input of the D-type flip-flop 890 (FIG. 9H). The clocking of the flip-flop 890 by the clocking signals appearing on lines 874 and 876 will output a bus reset drive signal BRSTD over its Q output line 892 and line 894, through the buffer 896, an open drain connecting pad 898 and over the line 899. The Q output signal of flip-flop 890 (FIG. 9H) is also transmitted to one input of an AND gate 900 (FIG. 9H) through the NOR gate 902, the NOR gate 904 and through the buffer 906 and over line 908 to reset the flip-flops 878h–878n inclusive (FIGS. 9E and 9F). The output signal of the NOR gate 904 is also transmitted over line 910 through the buffer 912 for resetting the flip-flops 878a–878g inclusive (FIGS. 9D and 9E).

When a power down condition occurs, the signal DOWN/ will appear on line 86 (FIG. 9G) of bus 85 (FIG. 2) which is transmitted through a connecting pad 914, the Schmidt trigger circuit 916, the NOR gate 918, the inverter 920 and over line 922 through the buffer 924 (FIG. 9H), the inverter 926, the connecting pad 930 and over line 932 to the microprocessor 20 as a non-maskable interrupt signal NMI indicating, when active high, that the signal DOWN/ is active. When a power loss of the DRAM memory 44 (FIG. 1) occurs, the signal 5BSEN (FIG. 9G) appearing on line 87 of bus 85 will go low for transmission through the input pad 936, the Schmidt trigger circuit 938 and into the clock driver 940. The buffer driver 940 will output over line 942 (FIG. 9G and 9A) the signal SDWN which is transmitted through the inverter 952 (FIG. 9B) for resetting the flip-flops 776a–776h inclusive (FIGS. 9B and 9C). The signal SDWN is also transmitted over lines 942 and 954 (FIG. 9A) to the NOR gate 810 whose low output signal over line 811 resets the counter 813 and the flip-flops 812e and 812f (FIGS. 9D, 9E and 9F).

The buffer driver 940 (FIG. 9G) will also output over line 944 the inverted shut down signal SDWN/ which is transmitted together with the signal SDWN to the oscillator 818 (FIG. 9A) disabling the operation of the oscillator. The signal SDWN appearing on the output line 942 is also transmitted over line 946 (FIG. 9G), line 948 and through the inverter 950 and over line 954 to the reset input on the flip-flop 890. The signal SDWN is also transmitted over line 952 (FIG. 9H) to the NOR gate 904 for generating a reset signal to the counter 877 as described previously.

Figure 11:
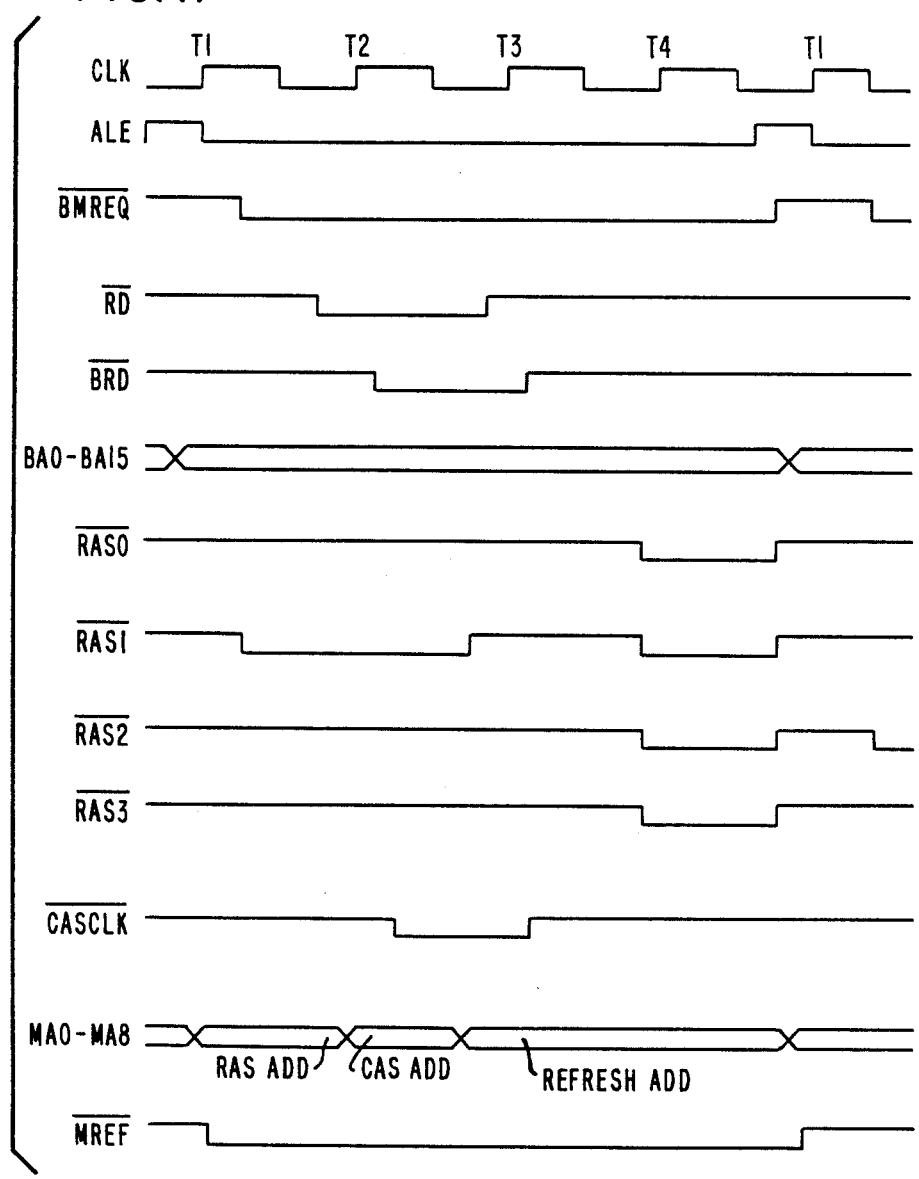
FIG. 11 is a timing diagram of the control signals generated during the accessing of the DRAM memory and a subsequent transparent refresh operation by the microprocessor.

Referring now to FIG. 11, there are shown the wave forms of the signals generated during a memory read operation by the microprocessor 20 (FIG. 1) of the DRAM memory unit 44 (FIG. 1) and a subsequent transparent refresh operation. As previously described, the microprocessor 20 will generate the status signals S0 and S1 (FIG. 3E) indicating the type of machine cycle the microprocessor is performing together with the address latch enable signal ALE (FIG. 11) which, when going low, will latch the status signals S0, S1, and IO-M/ for the next machine cycle. The signal level of the status signals will indicate whether it is a memory access operation or not. As previously described, these signals will result in the generation of the active low bus memory request signal BMREQ/ (FIGS. 3D and 11) together with the active low memory refresh signal MREF/ (FIGS. 3D and 11) indicating the start of a machine cycle. After the BMREQ/ signal goes low, the read signal RD/ outputted by the microprocessor 20 (FIG. 1) will go low, resulting in the generation of the active low bus read signal BRD/ in the manner described previously.

The generation of the active low signal BMREQ/ (FIG. 11) also results in the memory request signals MREQB and MREQ clocking the flip-flop 420 (FIG. 5A), thereby initiating a timing sequence which results in the generation of the column enable strobe clock CASCLK/ (FIGS. 5D and 11) in the manner described previously. This signal will strobe the column address bits into the DRAM memory unit 44 (FIG. 1) as part of the memory access operation. During this access time, one of the row address strobes signal RAS0/, RAS1/, RAS2/, RAS3/ (FIG. 11) will go active low for addressing one of the ranks of memory in the DRAM memory unit 44. The microprocessor 20 will output the refresh address signals MA8-MA0 (FIG. 11) which are refreshed when the signals RAS0/-RAS3/ inclusive go active low as shown in FIG. 11 between clock signals T3 and T4 during a transparent refresh cycle. The signal CASCLK/ going low at T2 will strobe in the CAS address signals MA0-MA8. The signal CASCLR (FIG. 5D) generates the signal RAS1/ (FIG. 11) which causes the M80-MA8 lines in the bus 42 (FIG. 1) to output the refresh address signals MA0-MA8 inclusive (FIG. 11) to the memory 44. Thus the refreshing of the operation of the DRAM memory unit 44 is transparent to the microprocessor 20 during an instruction fetch machine cycle.

Figure 12:
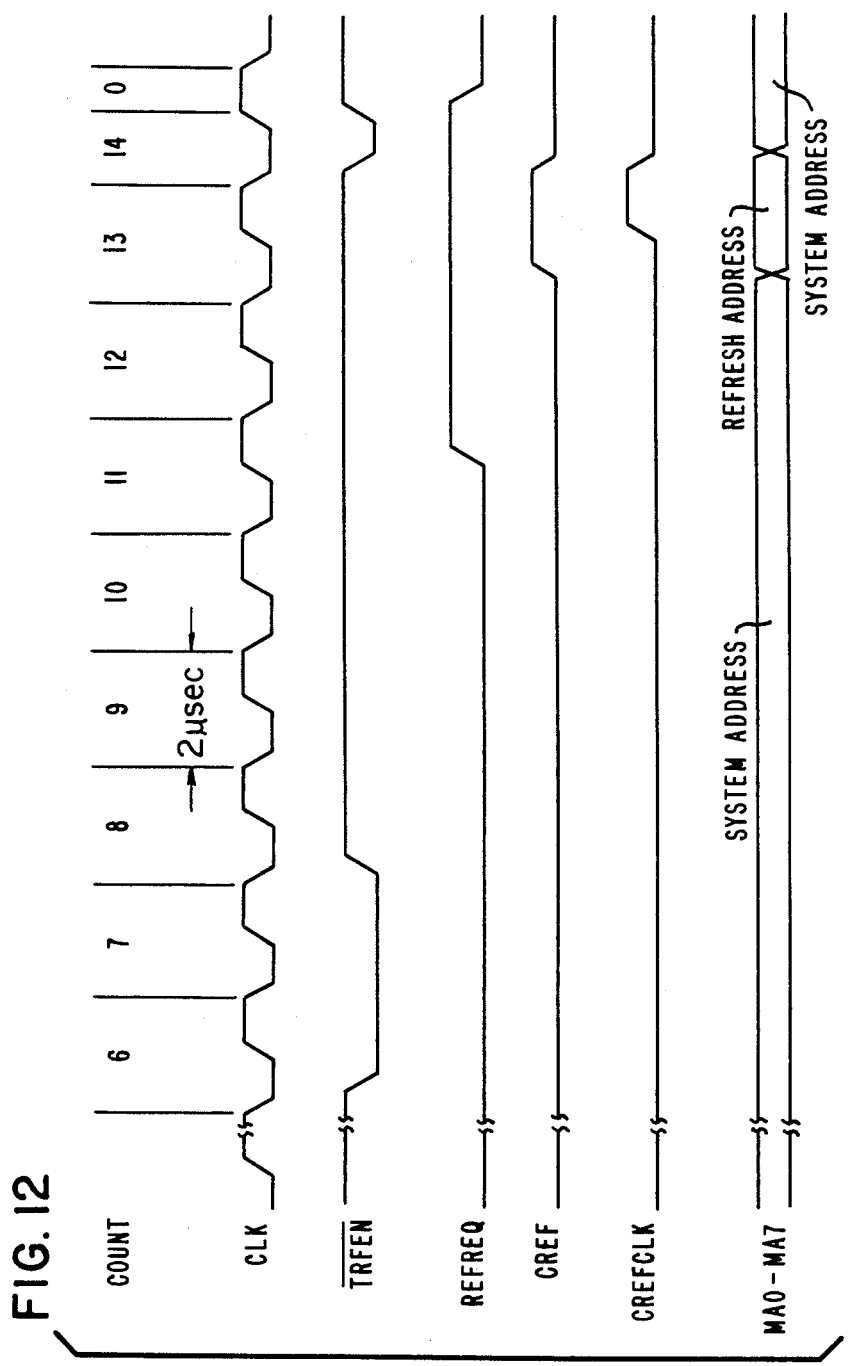
FIG. 12 is a timing diagram of the control signals generated during a contention refresh operation.

Referring now to FIG. 12, there are shown the wave forms of signals generated during a transparent and contention refresh cycle. As previously described, the counter 813 comprising the flip-flops 812a-812d inclusive (FIGS. 9D and 9E) is clocked by the oscillator 818 (FIG. 9A) operating at a frequency of 500 KHz with the clock signal having a period of 2 microseconds. As illustrated in FIG. 12, when the falling edge of the output clock signals CLK goes active at between counts 6 and 7, the transparent refresh enable signal TRFEN/ will be outputted over line 856 (FIG. 9C) clocking the flip-flop 624 (FIG. 5G) at the last clear timing period. The time period before the signal TRFEN/ goes low allows the processor 20 (FIG. 1) to run a plurality of instruction fetches which increase the performance of the processing system. The clocking of the flip-flop 624 results in the high Q output signal removing the reset signal of the flip-flop 630 enabling the flip-flop to output a low signal over line 634 to one input of the NOR gate 674 when clocked by the flip-flop 488 (FIG. 5C) at the time the RASCLR signal (FIG. 5D) is generated. If the memory refresh signal MREF/ goes active low (FIG. 11) at the start of the next machine cycle, this signal will appear on line 370 (FIG. 5G) which enables the NOR gate 674 (FIG. 5G) to output a high signal over line 675 through the inverter 676 and over line 678 to one input of the NOR gate 492 (FIG. 5C). The NOR gate 492 will output a high signal over line 493 to the D input of the flip-flop 494 whose low Q/ output signal is transmitted over line 496 and through the AND gate 498, the NOR gate 500 and the buffer 502 as the transparent refresh clock TREFCLK. As previously described, this signal will reset the counter 813 (FIG. 9D) together with clocking the refresh address counter comprising the flip-flops 766a-766h inclusive (FIGS. 9B and 9C) for outputting refresh addresses to the DRAM memory unit 44 in the manner described previously. The resetting of the counter 813 will occur at the beginning of a transparent refresh operation or at the end of a contention refresh operation at count fourteen (FIG. 12) where 28 microseconds has elapsed since the end of the previous refresh operation.

If the transparent refresh clock signal TREFCLK is not generated, the output of the counter 813 (FIG. 9D), upon reaching a count of eleven (FIG. 12) or approximately 22 microseconds after the last refresh operation, sets the flip-flop 812e (FIG. 9E) enabling the flip-flop to output the high refresh request signal REFREQ (FIG. 9F) over line 866 to the D input of the flip-flop 512 (FIG. 5A) which is synchronized with the system clock signals CLKB appearing on input line 152 (FIG. 5A). This signal initiates a contention refresh operation. The generation of the refresh request signal REFREQ also results in a clock signal appearing on the input line 602 of flip-flop 616 (FIG. 5F) which is transmitted over line 618 and to the NAND gate 536. The gate 536 also receives the memory request signal MREQ (FIG. 5A) over line 528. Any time the signal MREQ is active high during a contention refresh operation, the output signal of gate 536 will go low, which is transmitted over line 534 to the NAND gate 532 (FIG. 5H), resulting in the bus ready signal BRDY going low which prevents any requesting device from accessing the DRAM memory unit 44 until a contention refresh operation has been completed. The NAND gate 532 also receives the wait state signal IOSRDY (FIG. 7A) which delays the raising of the signal BRDY in accordance with the operating speed of the microprocessor 20 as previously described. The gate 532 further receives over line 530 the Q/ output signal of flip-flop 526 (FIG. 5F) enabling the bus ready signal BRDY to go low when the signal MREQ goes high after the signal REFREQ (FIG. 12) has become active high.

At the count of thirteen and a half (FIG. 12), the flip-flop 812f (FIG. 9F) will output a low Q/ signal over line 838 to the NAND gate 840 which outputs the contention refresh signal CREF (FIG. 12) over line 842 to the DRAM address multiplexer 80 (FIG. 2) and also to the NAND gate 870 which outputs the contention refresh clock CREFCLK (FIG. 12) at a half clock cycle later over line 872 to the DRAM memory RAS decode unit 76 (FIG. 2). The unit 76 strobes the refresh row address bits MA0-MA7 inclusive (FIG. 12) into the DRAM memory unit 44 under the control of the row address strobe signals RAS1-RAS3 inclusive (FIG. 1) in a manner that is well known in the art. When the flip-flop 812d (FIG. 9E) is clocked, a high signal will appear on its Q output which is transmitted over line 862 to the NAND gate 857 (FIG. 9C) whose low output signal is inverted by the inverter 861 and appears as the contention refresh clear signal CNTRF-CLR on line 863 which resets the counter 813 (FIG. 9D and 9E) and flip-flops 812e and 812f (FIGS. 9E and 9F).

Figure 13:
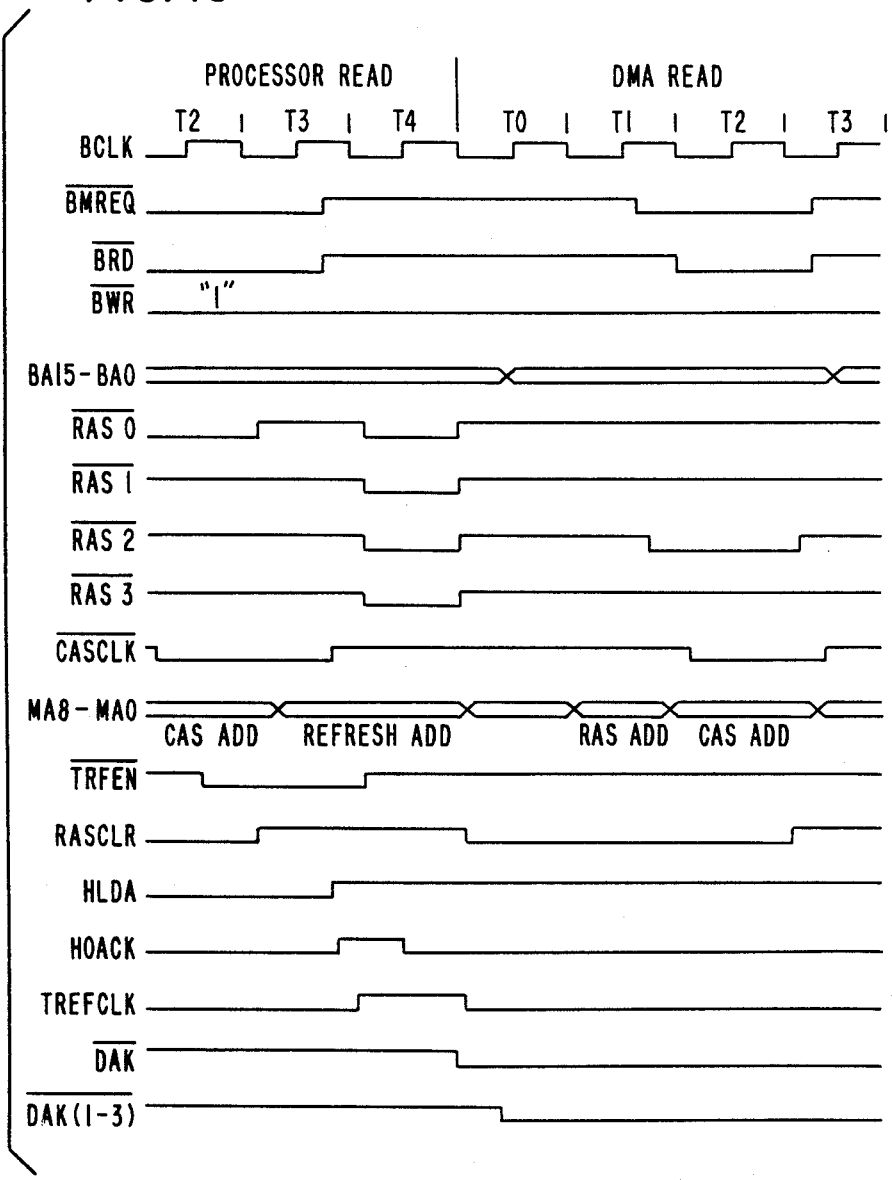
FIG. 13 is a timing diagram of the control signals generated during a transparent refresh operation when a microprocessor or remote peripheral device requests access to the DRAM memory.

Referring now to FIG. 13, there is shown a timing diagram of the control signals associated with the present invention which are generated during a transparent refresh cycle when the microprocessor or a remote peripheral device is requesting access to the memory 44 (FIG. 1). When a remote peripheral DMA device such as the disc file 56 (FIG. 1) requests access to the DRAM memory unit 44, the microprocessor 20 will output the high hold acknowledge signal HLDA (FIGS. 3E and 13) over line 66K resulting in the signal BHLDA appearing on line 186. This latter signal enables the NAND gate 182 (FIG. 3A) to clock the flip-flop 180 resulting in the generation of the DMA bus acknowledge signal DAK (FIG. 13) which, as previously described, controls the tri-state drivers 254 (FIG. 3B), 354 (FIG. 3D), 274, 372 and 386 (FIG. 3F) allowing the disc file to take control of the memory system for accessing the memory.

If at this time the hold acknowledge signal BHLDA is active high and a transparent refresh operation has been initiated by the transparent refresh enable signal TRFEN/ becoming active low (FIG. 13), the hold off acknowledge signal HOACK (FIGS. 5D and 13) is generated which prevents the DMA unit from taking control of the bus memory system as will now be described. The transparent refresh enable signal TRFEN/ appearing on line 592 (FIG. 5E) is inverted by the inverter 622 (FIG. 5G) for clocking the flip-flop 624, whose high output signal appearing over line 628 removes the reset condition of the flip-flop 630, as previously described. The flip-flop 630, which is clocked when the signal RASCLK goes high, will output a low signal on its Q/ output line 634 and into one input of the NOR gate 636 (FIG. 5H). The other input to the NOR gate 636 also receives a low signal which is derived from the active high signal BHLDA appearing on line 676. This signal is inputted into the NAND gate 672, whose low output signal over line 673 will enable the NOR gate 636 to output a high signal over line 642 to the cross coupled NOR gate 644 (FIG. 5D), allowing the high hold off acknowledge signal HOACK to appear on the Q output line 184. This signal is transmitted to one input of the NOR gate 182 (FIG. 3A) blocking the NOR gate from transmitting the signal BHLDA, which appears on the other input line 190. The hold signal BHLDA appearing on line 186 and transmitted through the inverter 188 normally enables the NOR gate 182 to output a high signal over line 181 to the flip-flop 180 (FIG. 3B) whose low Q/ output signal over line 191 will enable the buffer driver 192 to generate the DMA acknowledge signals DAK. By blocking the NOR gate 182 from outputting the high signal, the signal HOACK allows a transparent refresh operation to occur while the DMA unit waits for the microprocessor to transfer operation of the memory bus system to the DMA unit.

At the start of the transparent refresh operation, the signal TREFEN/ will go high (FIG. 13) when the clock signals RAS1-RAS3 inches go low which results in the resetting of the flip-flops 624 and 630 (FIG. 5G) upon the transparent refresh clock signal TREFCLK going high (FIG. 13). The resetting of the flip-flop 630 outputs a low signal over line 634 to the NOR gate 636 (FIG. 5H) which outputs a low signal over lines 642 to the set input of the cross-coupled NAND gate 644, thereby terminating the high HOACK signal (FIG. 13). The removal of the high HOACK signal from the NOR gate 182 (FIG. 3A), together with the hold acknowledge signal BHLDA still being high at this time, enables the flip-flop 180 (FIG. 3B) to output a high Q/ output signal to the clock driver 192 which outputs the DMA acknowledge signal DAK/ over line 194 enabling the requesting DMA unit to control the system bus 40 to complete the memory access operation.

It will be seen that the invention thus provides a system and method for enabling a transparent refresh operation to occur on the DRAM memory unit 44 before the microprocessor transfers control of the memory unit to a requesting remote peripheral device, thus eliminating a contention refresh operation which would require the interruption of a memory access operation by a requesting device.

While there has been described a preferred embodiment of invention and its mode of operation, it will be apparent to those skilled in the art that changes may be made in circuits described without departing from the spirit and scope of this invention as set forth in the amended claims, and that in some cases certain features of the invention may be used to advantage or modified without corresponding changes in other features while certain features may be substituted for or eliminated as appreciated by those skilled in the art. Therefore, the scope of the invention is not to be restricted except as required by the following claims.

What is claimed is:

1. In a data processing system including a data processor, a dynamic memory and a peripheral device coupled to said processor for requesting access to the dynamic memory, a memory controller comprising:

means for refreshing the dynamic memory when enabled;

first circuit means responsive to first status signals and timing signals outputted from said processor for generating a first control signal to enable said refreshing means;

second circuit means responsive to a second status signal from the processor acknowledging the request of the peripheral device for generating a second control signal to transfer control of the memory to the requesting peripheral device;

third circuit means coupled to said first circuit means and said processor for generating a third control signal representing the simultaneous occurrence of said first control signal and said second status signal; and fourth circuit means coupled to said first and second circuit means for disabling the second circuit means from generating said second control signal in response to the generation of said third control signal and said second status signal thereby disabling the requesting peripheral device from accessing the memory and enabling the memory to be refreshed prior to the time the control of the memory is transferred to the requesting peripheral device by the processor wherein said second circuit means includes a bistable member operated by said timing signals to output said second control signal in response to receiving said second status signal, and further includes a gating circuit coupled to one input of said bistable member for outputting a binary signal disabling said bistable member from outputting said second control signal in response to receiving said third control signal and said second status signal.

2. The memory controller of claim 1 in which said first circuit means includes a plurality of first bistable members receiving said first status signals for generating a fourth control signal in response to receiving said first status signals, said first circuit means further including a second bistable member controlled by said fourth control signal and said timing signals for generating a clock signal controlling the operation of said refreshing means.

3. The memory controller of claim 2 in which said first circuit means further includes means operated by said clock signal for generating said first control signal at the end of a first predetermined time period after said first control signal generating means has been operated by said clock signal.

4. The memory control of claim 3 in which said first control signal generating means is a counter.

5. In a data processing system including a multispeed data processor, a dynamic memory and a remote peripheral device requesting access to the dynamic memory, a memory controller semiconductor chip comprising;

means for refreshing the dynamic memory when enables;

first circuit means responsive to a plurality of first status signals representing the operating cycle of the processor and clock signals outputted by the processor for generating a transparent refresh control signal to enable said refreshing means to refresh the memory;

second circuit means responsive to a second status signal outputted by the processor acknowledging the request of the peripheral device for generating a first control signal to transfer control of the memory to the requesting peripheral device; and third circuit means coupled to said first circuit means and said processor for generating a second control signal representing the simultaneous occurrence of said first control signal and said second status signal;

said second circuit means further including a gating circuit coupled to said first and third circuit means for disabling the second circuit means from generating said first control signal in response to the generation of said second status signal and said second control signal thereby disabling the remote peripheral device access to the dynamic memory and enabling said refresh means to refresh the memory prior to the time control of the memory is transferred by the processor to the requesting peripheral device in which said first circuit means includes a plurality of latching members receiving said first status signals for generating a third control signal, said first circuit means further including a first bistable member enabled by said third control signal and said clock signals to generate a transparent refresh clock signal controlling the operation of said refreshing means;

said first circuit means further includes a counter operated by said transparent refresh clock signal for generating said transparent refresh control signal at the end of a first predetermined time period after the counter has been operated by said transparent refresh clock signal and a first contention refresh control signal at the end of a second predetermined time period for enabling said refresh mean as to refresh the memory.

6. The memory controller chip of claim 5 in which said counter generates a second contention refresh control signal at the end of a third predetermined time period, said memory controller chip further including fourth circuit means responsive to the generation of said second contention refresh control signal for outputting a fourth control signal to the peripheral device and preventing access to the memory by the peripheral device.

7. The memory controller chip of claim 6 in which the processor outputs a third status signal representing the operating speed of the processor, and in which said memory controller chip further includes a fifth circuit means coupled to said fourth circuit means and receiving said third status signal to generate a delay signal representing a time period whose length varies in accordance with the speed of the processor, said delay signal delaying said fourth circuit means from generating a sixth control signal after the memory has been refreshed which enables the peripheral device access to the memory.

8. The memory controller chip of claim 5 in which said second circuit means includes a bistable member operated by said clock signals to output said first control signal in response to receiving said second status signal.

* * * * *